(12) United States Patent
Casey

(10) Patent No.: US 9,803,879 B2
(45) Date of Patent: Oct. 31, 2017

(54) LOUVER SYSTEM

(71) Applicant: Daniel P. Casey, Seattle, WA (US)

(72) Inventor: Daniel P. Casey, Seattle, WA (US)

( * ) Notice: Subject to any disclaimer, the term of this patent is extended or adjusted under 35 U.S.C. 154(b) by 542 days.

(21) Appl. No.: 14/386,766

(22) PCT Filed: Mar. 19, 2013

(86) PCT No.: PCT/US2013/033028
§ 371 (c)(1),
(2) Date: Sep. 19, 2014

(87) PCT Pub. No.: WO2013/142535
PCT Pub. Date: Sep. 26, 2013

(65) Prior Publication Data
US 2015/0079895 A1     Mar. 19, 2015

Related U.S. Application Data

(63) Continuation-in-part of application No. 13/503,326, filed on Apr. 20, 2012, now Pat. No. 8,742,938, and (Continued)

(51) Int. Cl.
| | |
|---|---|
| *A62C 2/06* | (2006.01) |
| *F24F 11/00* | (2006.01) |
| *F24F 13/08* | (2006.01) |
| *F24F 13/15* | (2006.01) |
| *G08B 17/10* | (2006.01) |

(Continued)

(52) U.S. Cl.
CPC ...... *F24F 11/0001* (2013.01); *F24F 11/0017* (2013.01); *F24F 13/082* (2013.01); *F24F 13/14* (2013.01); *F24F 13/15* (2013.01); *G08B 17/10* (2013.01); *H05K 5/0213* (2013.01); *H05K 5/0217* (2013.01); *F24F 11/0012* (2013.01);
(Continued)

(58) Field of Classification Search
CPC .... F24F 11/0001; F24F 11/0017; F24F 13/14; F24F 13/15; F24F 13/028; F24F 11/0012; F24F 2011/0075; F24F 2013/1446; G08B 17/10
USPC .................................. 454/257, 318–319, 314
See application file for complete search history.

(56) References Cited

U.S. PATENT DOCUMENTS

| | | |
|---|---|---|
| 3,434,133 A | 3/1969 | Collum |
| 3,821,512 A | 6/1974 | Stanford |

(Continued)

FOREIGN PATENT DOCUMENTS

| | | |
|---|---|---|
| EP | 2385319 A2 | 11/2011 |
| WO | 94/26352 A1 | 11/1994 |
| WO | 2005/035910 A1 | 4/2005 |

*Primary Examiner* — Helena Kosanovic

(57) ABSTRACT

A louver system for controlling airflow in a duct from a forced air heating, ventilation, and air conditioning (HVAC) system with a housing and a louver located on a mounting fascia. The system having a longitudinal slat located in the perimeter wall that is movable between the fully open position and the fully closed position via a slat positioning assembly. The slat positioning assembly is powered by a mainspring assembly. A winding assembly is operatively coupled to the mainspring assembly which is wound by a motor or a hand crank. A local control system having a microprocessor, a transmitter, and a receiver sends a positioning signal to the slat positioning assembly that rotates the slat to a specified position via power from the mainspring assembly.

20 Claims, 20 Drawing Sheets

Related U.S. Application Data a continuation-in-part of application No. 13/424,045, filed on Mar. 19, 2012, now Pat. No. 8,979,622, which is a continuation-in-part of application No. 12/551,214, filed on Aug. 31, 2009, now abandoned.

(51) Int. Cl.
  *H05K 5/02* (2006.01)
  *F24F 13/14* (2006.01)

(52) U.S. Cl.
  CPC ............... *F24F 2011/0075* (2013.01); *F24F 2013/1446* (2013.01)

(56) References Cited

U.S. PATENT DOCUMENTS

| | | | |
|---|---|---|---|
| 4,181,253 A | 1/1980 | Barlow | |
| 4,228,006 A | 10/1980 | Hanna | |
| 4,333,489 A | 6/1982 | Magill et al. | |
| 4,417,687 A | 11/1983 | Grant | |
| 4,623,878 A | 11/1986 | Schoenwetter | |
| 4,710,756 A | 12/1987 | Thornburg et al. | |
| 4,993,970 A | 2/1991 | Littrell | |
| 5,117,122 A | 5/1992 | Hogarth et al. | |
| 5,139,464 A | 8/1992 | Lehnert | |
| 5,348,072 A * | 9/1994 | Keutgen | B22D 11/147 164/420 |
| 5,348,078 A | 9/1994 | Dushane et al. | |
| 5,364,304 A | 11/1994 | Hampton | |
| 5,443,420 A * | 8/1995 | Kim | F24F 1/0011 251/129.1 |
| 5,458,311 A | 10/1995 | Holbrook | |
| 5,519,382 A | 5/1996 | Pope et al. | |
| 5,530,435 A | 6/1996 | Toms et al. | |
| 5,736,674 A | 4/1998 | Gretz | |
| 5,959,246 A | 9/1999 | Gretz | |
| 6,053,809 A | 4/2000 | Arceneaux | |
| 6,072,397 A | 6/2000 | Ostrowski | |
| 6,114,967 A | 9/2000 | Yousif | |
| 6,120,262 A | 9/2000 | McDonough et al. | |
| 6,160,487 A | 12/2000 | DeLuca | |
| 6,181,251 B1 | 1/2001 | Kelly | |
| 6,537,146 B1 * | 3/2003 | Haynes | F24F 13/15 454/290 |
| 6,630,800 B2 | 10/2003 | Weng | |
| 7,034,702 B2 | 4/2006 | Thomas et al. | |
| 7,045,706 B1 | 5/2006 | Lincoln, III et al. | |
| 7,336,165 B2 | 2/2008 | Fuchs | |
| 7,522,063 B2 | 4/2009 | Ehlers | |
| 7,656,308 B2 | 2/2010 | Atkins | |
| 7,715,441 B2 | 5/2010 | Binder | |
| 7,982,434 B2 | 7/2011 | Kimball et al. | |
| 8,558,110 B1 | 10/2013 | Shotey | |
| 8,742,938 B2 | 6/2014 | Casey | |
| 8,979,622 B2 | 3/2015 | Casey | |
| 2001/0055947 A1 | 12/2001 | McCabe | |
| 2004/0159713 A1 | 8/2004 | Schmidt et al. | |
| 2005/0056581 A1 | 3/2005 | Arguello | |
| 2006/0048525 A1 | 3/2006 | Cook | |
| 2006/0065510 A1 | 3/2006 | Kiko et al. | |
| 2006/0190739 A1 | 8/2006 | Soffer | |
| 2006/0286918 A1 | 12/2006 | Vargas | |
| 2007/0195526 A1 | 8/2007 | Dowling et al. | |
| 2007/0202794 A1 | 8/2007 | Antill | |
| 2008/0178526 A1 | 7/2008 | Browne et al. | |
| 2008/0258675 A1 | 10/2008 | Caldwell et al. | |
| 2009/0149123 A1 * | 6/2009 | Blagg | F24F 11/053 454/258 |
| 2009/0195349 A1 | 8/2009 | Frader-Thompson et al. | |
| 2009/0224423 A1 | 9/2009 | Vigorito et al. | |
| 2010/0226100 A1 | 9/2010 | Johnson et al. | |
| 2011/0053487 A1 | 3/2011 | Casey | |
| 2012/0199220 A1 | 8/2012 | Knepp et al. | |
| 2014/0299555 A1 | 10/2014 | Green | |
| 2014/0326331 A1 | 11/2014 | Mimone | |

\* cited by examiner

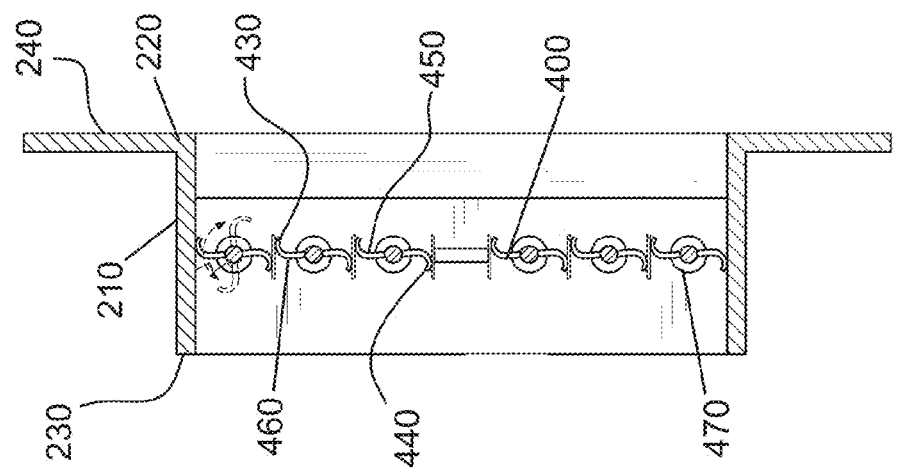
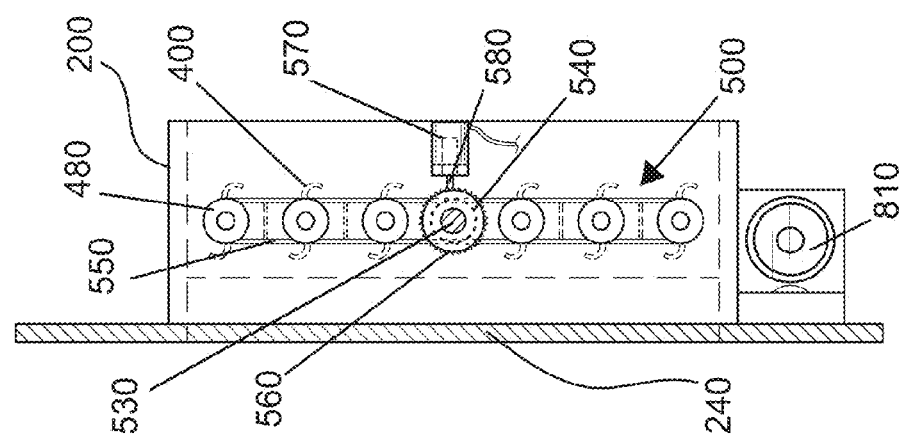
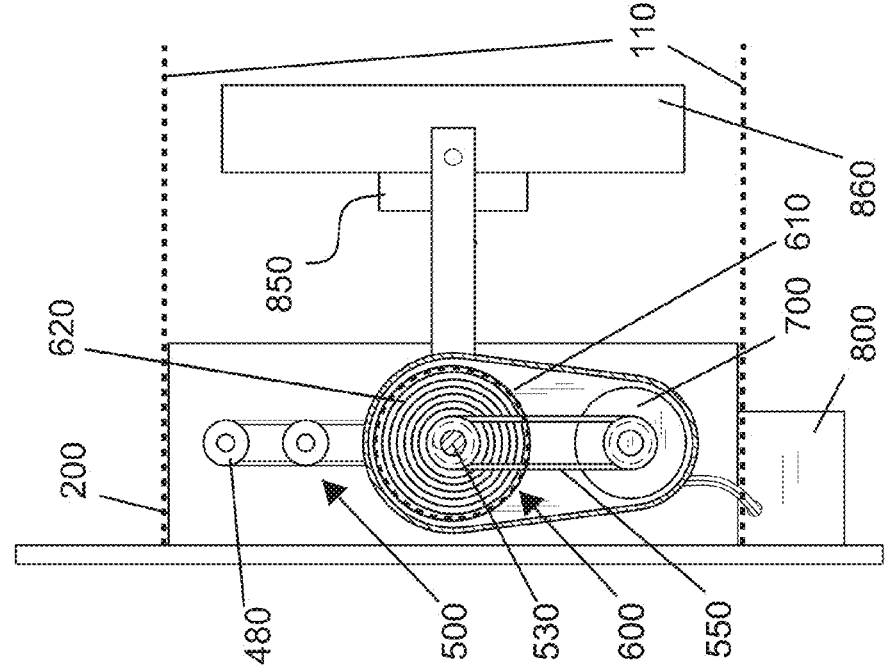

LOUVER SYSTEM

BACKGROUND OF THE INVENTION

Energy in various forms has been used to bring safety and comfort to the homes of people for generations. Even though there are numerous benefits associated with energy and its use, the associated costs can become quite significant. Fossil fuels are a frequently used, yet limited resource that must be managed wisely to preserve its availability for future generations. Conservation of energy not only helps today's user with their personal expenses, but it also helps society as a whole. The present invention teaches a system to control airflow from a duct from a forced air heating ventilation and aft conditioning system to conserve energy.

SUMMARY

The present invention features a louver system for controlling airflow in a duct from a forced aft heating, ventilation, and air conditioning (HVAC) system. In some embodiments, the system comprises a housing and a movable louver located on a mounting fascia.

In some embodiments, the system comprises a longitudinal slat located in the perimeter wall. In some embodiments, the system comprises a slat positioning assembly operatively coupled to the slat. In some embodiments, the system comprises a mainspring assembly operatively coupled to the slat positioning assembly. In some embodiments, the system comprises a winding assembly operatively coupled to the mainspring assembly. In some embodiments, the system comprises a motor and a hand crank operatively coupled to the winding assembly.

In some embodiments, the system comprises a local control system having a microprocessor, a transmitter, and a receiver that is operatively connected to the slat positioning assembly. In some embodiments, the local control system receives an activation signal then sends a positioning signal to the slat positioning assembly. In some embodiments, the slat positioning assembly rotates the slat to a specified position via power from the mainspring assembly.

In some embodiments, in the first position, the slat allows airflow. In some embodiments, in the second position, the slat inhibits airflow. In some embodiments, in a position between the first position and the second position, the slat allows a reduced airflow. In some embodiments, the mainspring assembly is wound via the winding assembly. In some embodiments, the winding assembly is actuated via the hand crank or the motor.

In some embodiments, the local control system is operatively connected to the motor. In some embodiments, the system comprises a power supply operatively connected to the motor and the local control system. In some embodiments, the system comprises an electricity generator comprising a turbine operatively connected to the power supply.

Any feature or combination of features described herein are included within the scope of the present invention provided that the features included in any such combination are not mutually inconsistent as will be apparent from the context, this specification, and the knowledge of one of ordinary skill in the art. Additional advantages and aspects of the present invention are apparent in the following detailed description and claims.

BRIEF DESCRIPTION OF THE DRAWINGS

FIG. 4 is a side view of the present invention.
FIG. 5 is a cross-sectional view in a sagittal plane of the present invention.
FIG. 6 is a cross-sectional view in a sagittal plane of the present invention.

DESCRIPTION OF PREFERRED EMBODIMENTS

Figure 1:
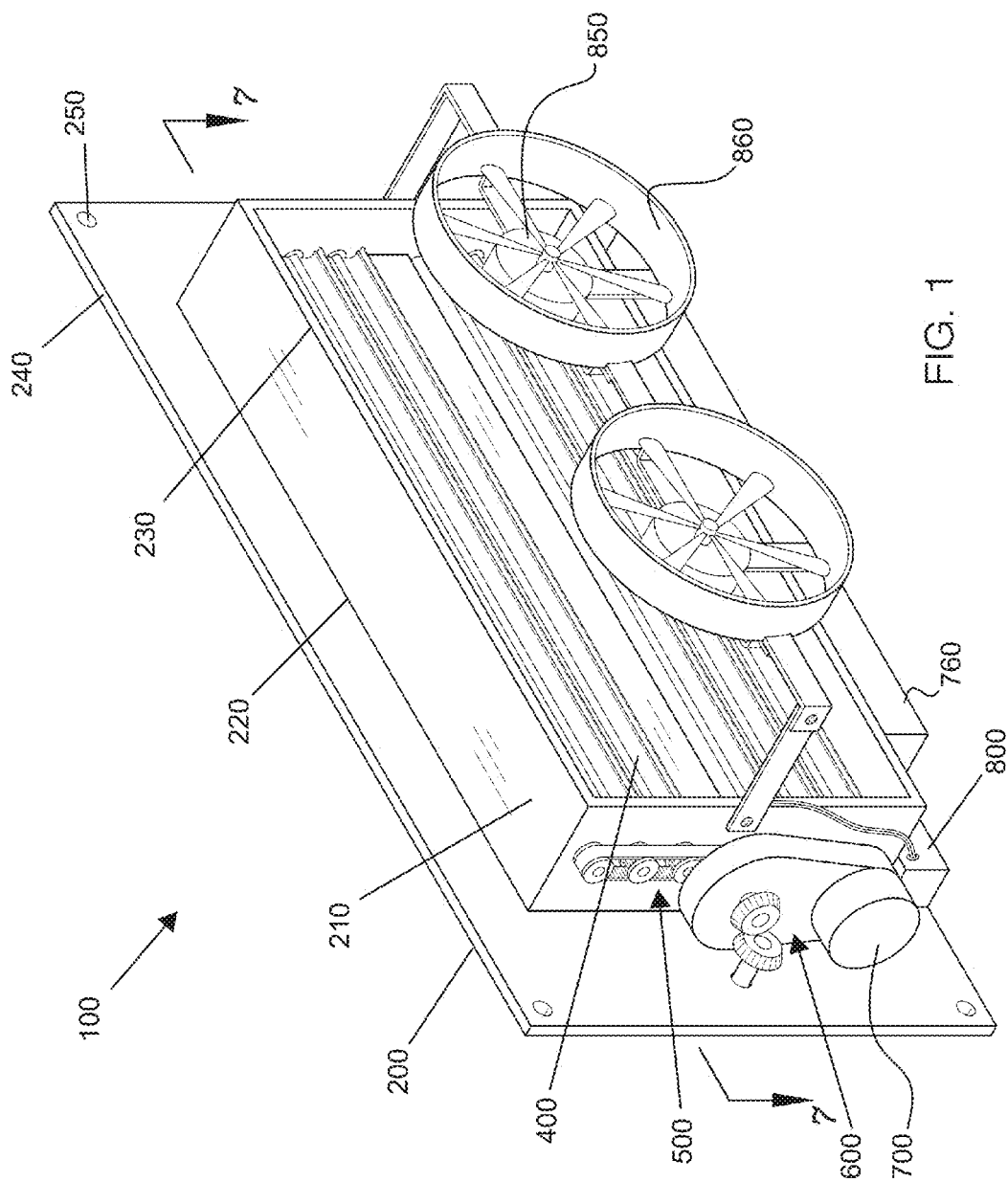
FIG. 1 is a perspective view of the present invention.
Figure 2:
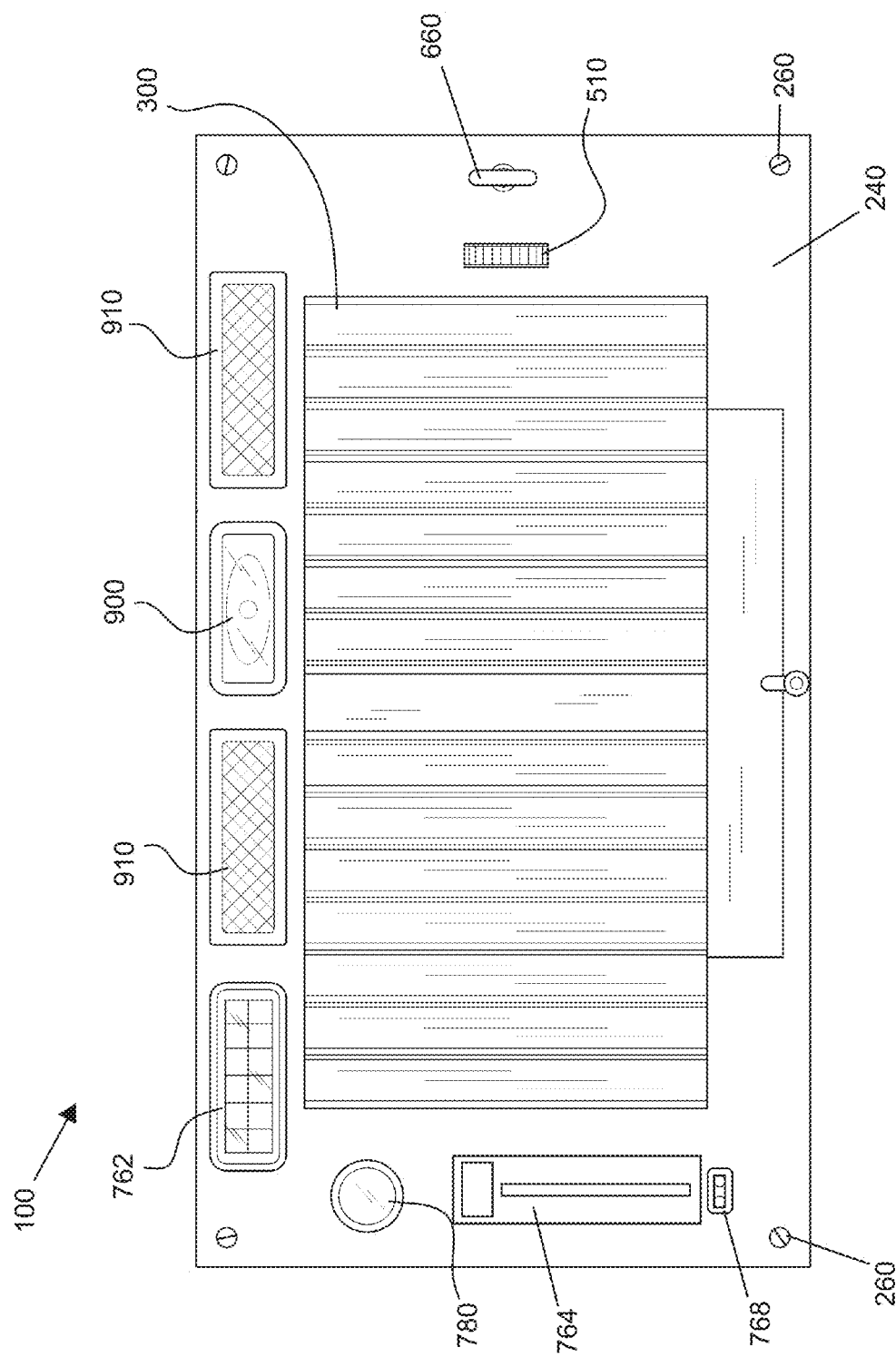
FIG. 2 is a front view of the present invention.
Figure 3:
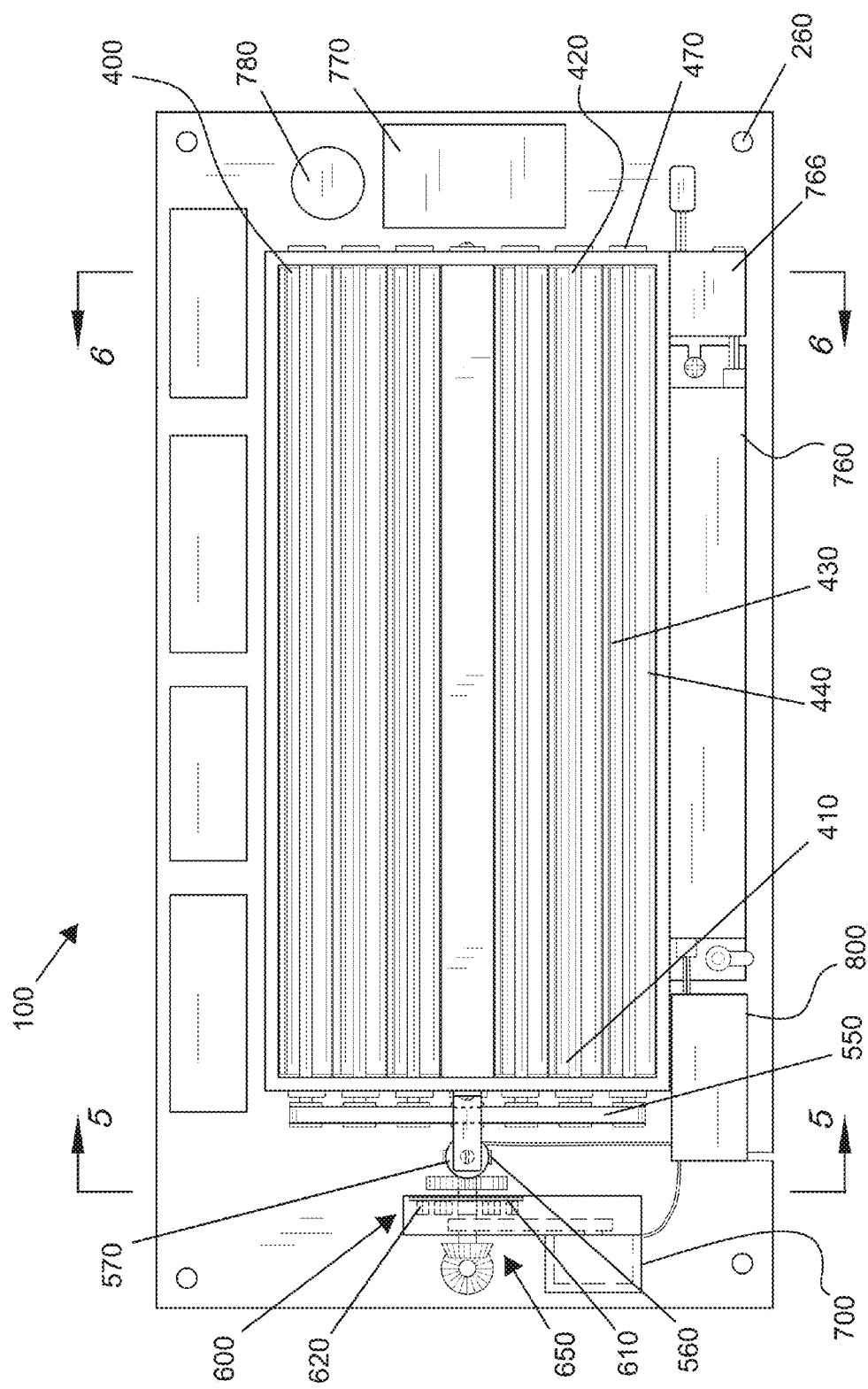
FIG. 3 is a rear view of the present invention.
Figure 7:
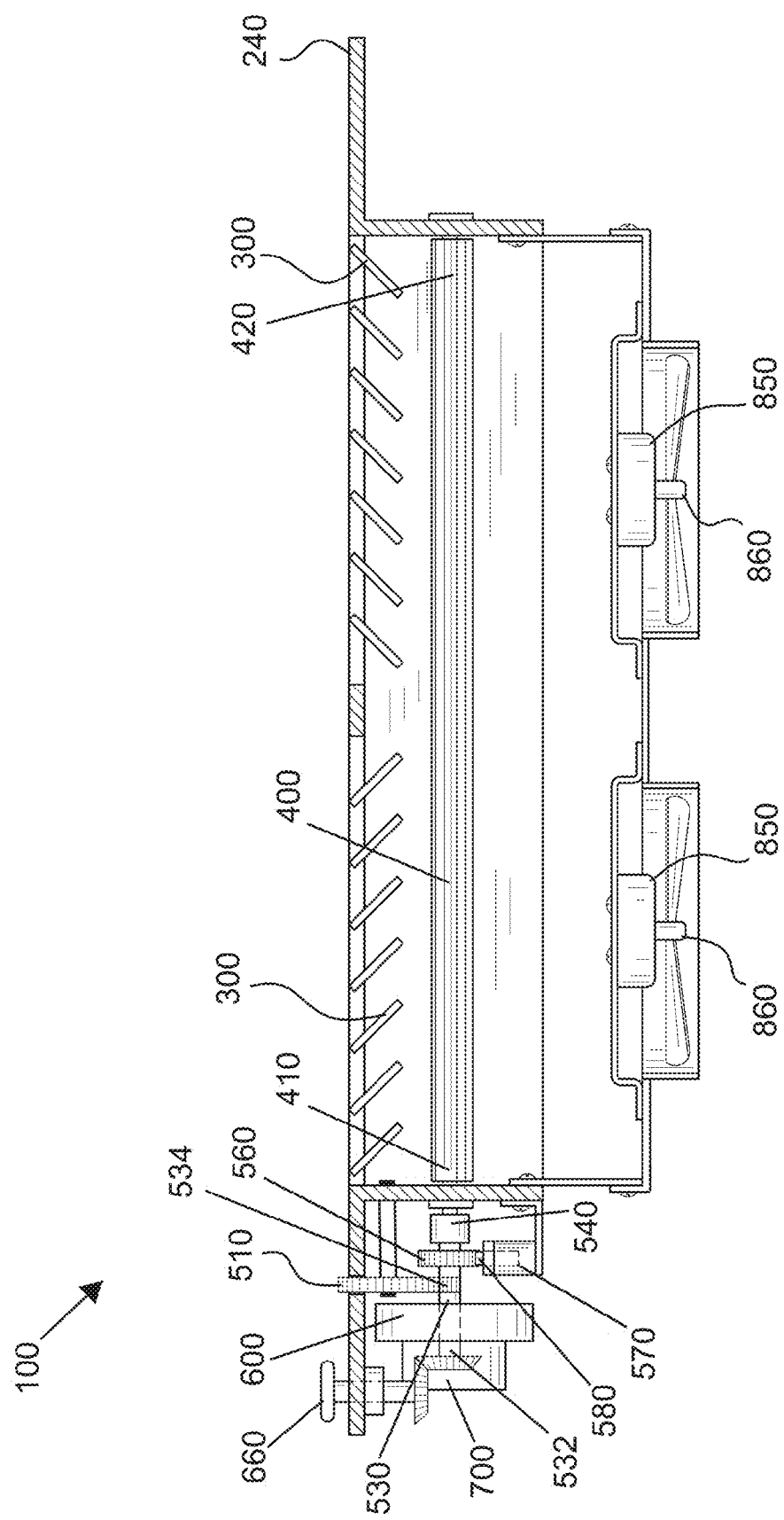
FIG. 7 is a cross-sectional view in a transverse plane of the present invention.
Figure 8:
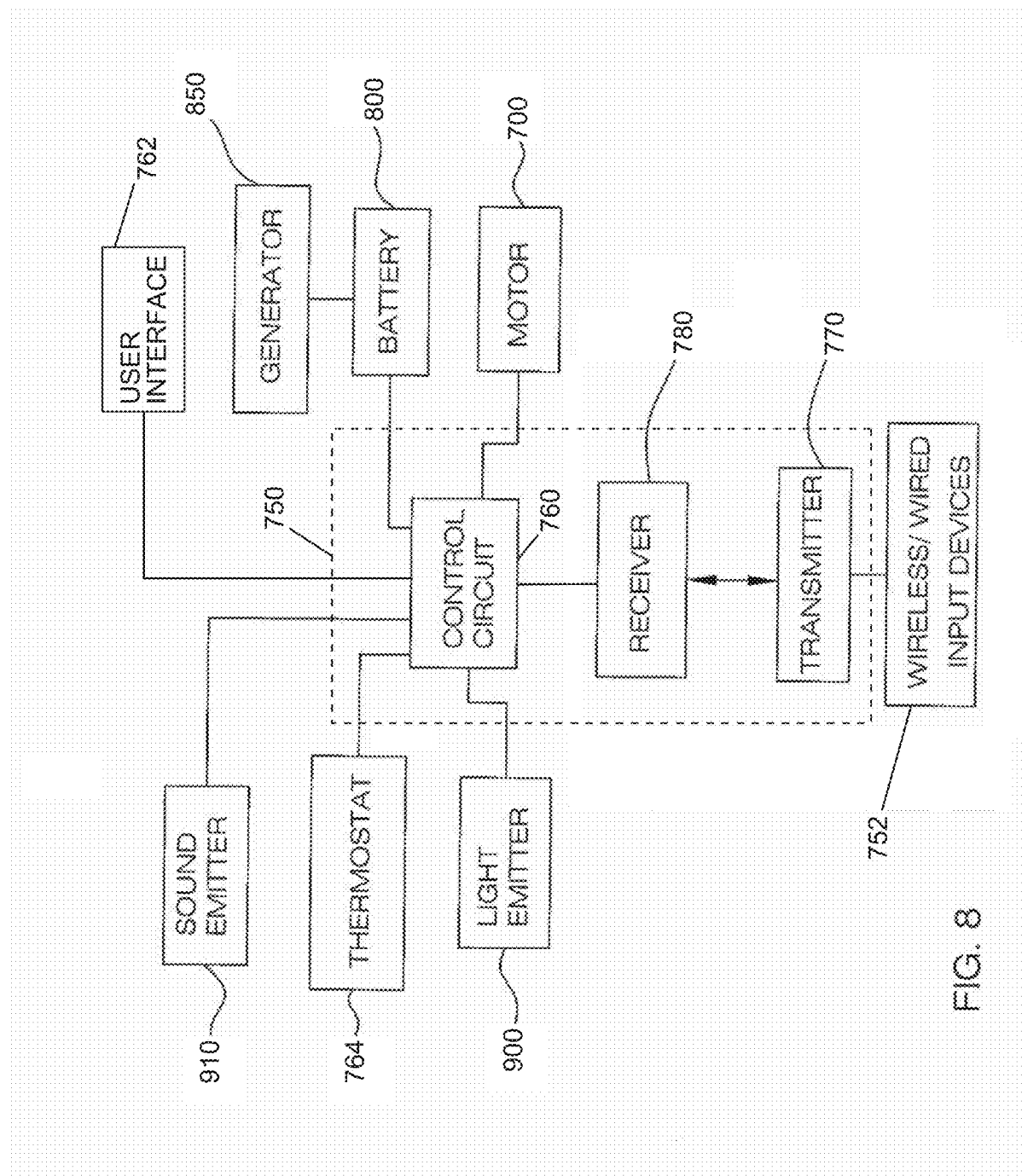
FIG. 8 is a schematic view of the present invention.
Figure 9:
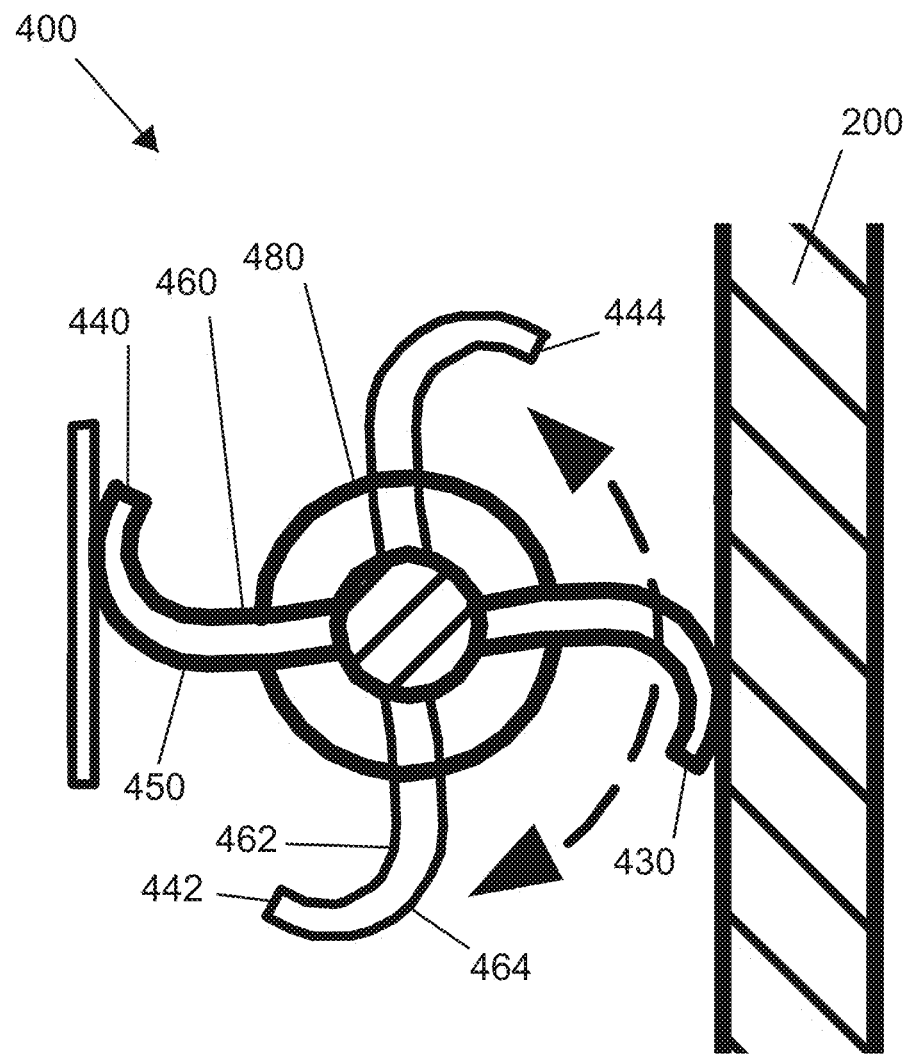
FIG. 9 is a cross-sectional view in a sagittal plane of an alternate embodiment of the slat of the present invention.

Following is a list of elements corresponding to a particular element referred to herein:
100 Louver system
110 Duct
200 Housing
210 Housing perimeter wall
220 Housing front edge
230 Housing rear edge
240 Mounting fascia
250 Mounting aperture
260 Fastener
300 Louver
400 Slat
410 Slat first end
420 Slat second end
430 Slat first side edge
440 Slat second side edge
442 Slat third side edge
444 Slat fourth side edge
450 Slat first surface
460 Slat second surface
462 Slat third surface
464 Slat fourth surface
470 Bearing
480 Slat positioning wheel
500 Slat positioning assembly 510 Manual slat positioner
530 Main shaft
532 Main shaft first end
534 Slat positioner gear
540 Main shaft positioning wheel
550 Drive belt
560 Positioning gear
570 Solenoid actuator
580 Engagement tip
600 Mainspring assembly
610 Ratcheting mechanism
620 Spring coil
650 Winding assembly
660 Hand crank
700 Motor
750 Local control system
752 Remote system
760 Microprocessor
762 User interface
764 Thermostat
766 Wireless network communication card
768 Communication port
770 Transmitter
780 Receiver
800 Power supply
810 Rechargeable battery
850 Electricity generator
860 Turbine
900 Light emitter
910 Sound emitter Referring now to FIG. 1-9, the present invention features a louver system (100) for controlling airflow in a duct (110) from a forced air heating, ventilation, and air conditioning (HVAC) system.

In some embodiments, the system (100) comprises a housing (200) having a housing perimeter wall (210), a housing front edge (220), a housing rear edge (230), and a mounting fascia (240) located on the housing front edge (220). In some embodiments, the mounting fascia is able to be mounted (abutted) against an outside surface of a wall. In some embodiments, the housing perimeter wall (210) connects with a duct (110) in a wall. In some embodiments, the housing perimeter wall (210) connects with a duct (110) not located in a wall.

In some embodiments, the system (100) comprises an adjustable louver that can be rotated (300) located on the mounting fascia (240). In some embodiments, the positional louver (300) is manually positioned.

In some embodiments, the system (100) comprises a longitudinal slat (400). In some embodiments, the slat (400) comprises a slat first end (410), a slat second end (420), a slat first side edge (430), a second side edge (440), a slat first surface (450), and a slat second surface (460). In some embodiments, the slat first end (410) is located in the housing perimeter wall (210) where it can rotate. In some embodiments, the slat second end (420) is located in the housing perimeter wall (210) where it can rotate. In some embodiments, a slat positioning wheel (480) is located on the slat first end (410). In some embodiments, a slat positioning wheel (480) is located on the slat second end (420).

In some embodiments, the longitudinal slat (400) comprises a slat third surface (462) and a slat fourth surface (464). In some embodiments, the longitudinal slat (400) comprises a slat third side edge (442), and a slat fourth side edge (444). In some embodiments, the longitudinal slat (400) comprises slat surfaces that are evenly spaced with respect to the angular position relative to one another when viewed from a sagittal plane.

In some embodiments, in a fully open position, the slat first side edge (430) is positioned toward the housing front edge (220) and the slat second side edge (440) is positioned toward the housing rear edge (230). In some embodiments, in a fully open position, the slat second side edge (440) is positioned toward the housing front edge (220) and the slat first side edge (430) is positioned toward the housing rear edge (230).

In some embodiments, the slat (400) is positioned fully in-line with a direction of airflow from a duct (110). In some embodiments, in the fully open position the slat (400) does not impede the airflow in the duct.

In some embodiments, in a fully closed position, the slat first side edge (430) is located toward the housing perimeter wall (210) and the slat second side edge (440) is located toward the housing perimeter wall (210). In some embodiments, the slat (400) is positioned fully perpendicular to the direction of airflow from the duct (110). In some embodiments, the slat first surface (450) or the slat second surface (460) faces the direction of airflow from the duct (110). In some embodiments, in the fully closed position the slat (400) impedes the airflow in the duct.

In some embodiments, the slat (400) is able to be rotated in a single continuous direction. In some embodiments, the slat (400) is able to be rotated in any direction. In some embodiments, the slat (400) is infinitely adjustable between the fully open position and the fully closed position.

In some embodiments, the system (100) comprises a slat positioning assembly (500) located in the housing (200). In some embodiments, the slat positioning assembly (500) comprises a centrally located main shaft (530). In some embodiments, the main shaft (530) has a main shaft positioning wheel (540) located on the main shaft (530) close to a main shaft first end (532). In some embodiments, the main shaft (530) is located parallel to the slat (400). In some embodiments, a drive belt (550) is located on and engages the main shaft positioning wheel (540) and the slat positioning wheel (480).

In some embodiments, a positioning gear (560) is located on the main shaft (530) close to the main shaft first end (532). In some embodiments, a solenoid actuator (570) is located in the housing (200). In some embodiments, the solenoid actuator (570) comprises an engagement tip (580) for engaging the positioning gear (560). In some embodiments, the solenoid actuator (570) comprises an engagement wheel for engaging the positioning gear (560). In some embodiments, the solenoid actuator (570) comprises an engagement gear for engaging the positioning gear (560).

In some embodiments, the system (100) comprises a mainspring assembly (600) located in the housing (200). In some embodiments, the mainspring assembly (600) comprises a ratcheting mechanism (610) operatively coupled to the main shaft (530). In some embodiments a spring coil (620) is operatively coupled to the ratcheting mechanism (610). In some embodiments, the ratcheting mechanism (610) holds the spring coil (620) in a static position of potential energy. In some embodiments, the ratcheting mechanism (610) allows the spring coil (620) to be wound into a position of potential energy.

In some embodiments, the system (100) comprises a winding assembly (650) located in the housing (200) operatively coupled to the mainspring assembly (600). In some embodiments, the winding assembly (650) comprising a hand crank (660). In some embodiments, the hand crank (660) projects through an aperture disposed on the mounting fascia (240). In some embodiments, upon actuation of the hand crank, the mainspring assembly is rewound. In some embodiments, the hand crank (660) is a knob. In some embodiments, the hand crank (660) is a crank.

In some embodiments, the system (100) comprises a motor (700) located in the housing (200) operatively coupled to the winding assembly (650). In some embodiments, the winding assembly (650) comprises a safety mechanism connected to the spring coil (620) to avoid over winding, for example, a ratcheting mechanism or a clutch mechanism.

In some embodiments, the system (100) comprises a local control system (750) located in the housing (200) having a microprocessor (760), a transmitter (770), and a receiver (780). In some embodiments, the local control system (750) is operatively connected to the slat positioning assembly (500). In some embodiments, the local control system (750) is operatively connected to the motor (700). In some embodiments, the local control system (750) is operatively connected to the solenoid actuator (570).

In some embodiments, the local control system (750) comprises a position sensor disposed on the main shaft (530). In some embodiments, the position sensor is disposed on the slat positioning assembly (500). In some embodiments, the position sensor is operatively connected to the microprocessor (760). In some embodiments, the position sensor sends a signal to the microprocessor (760) corresponding to the position of the at (400).

In some embodiments, the system (100) comprises a power supply (800) located in the housing (200) operatively connected to the motor (700) and the local control system (750). In some embodiments, the power supply (800) is alternating current electricity. In some embodiments, the power supply (800) is direct current electricity.

In some embodiments, the system (100) comprises an electricity generator (850) located in the housing (200) comprising a turbine (860). In some embodiments, the electricity generator (850) and the turbine (860) can rotate. In some embodiments, the electricity generator (850) is operatively connected to the power supply (800). In some embodiments, when airflow is present, the turbine (860) rotates the electricity generator (850) thereby producing a current. In some embodiments, the current charges the power supply (800).

In some embodiments, the system (100) comprises a plurality of electricity generators (850) comprising turbines (860) located in the housing (200). In some embodiments, the electricity generators (850) and turbines (860) can rotate.

In some embodiments, upon receiving an activation signal, the local control system (750) sends a positioning signal via the microprocessor (760) to the solenoid actuator (570). In some embodiments, the solenoid actuator (570) releases the stored energy from the mainspring assembly (600) via the disengagement of the engagement tip (580) from the positioning gear (560) to actuate the slot positioning assembly (500). In some embodiments, the slat positioning assembly (500) rotates the slat (400) to a specified position. In some embodiments, the specified position is determined by the position sensor.

In some embodiments, in the fully open position, the slat (400) allows airflow. In some embodiments, in the fully closed position, the slat (400) inhibits airflow. In some embodiments, in a position between the fully open position and the fully closed position (partially open), the slat (400) allows an inhibited rate of airflow.

In some embodiments, the mainspring assembly (600) is wound via the winding assembly (650). In some embodiments, the winding assembly (650) is actuated via the hand crank (660) or the motor (700). In some embodiments, the mainspring assembly (600) provides potential energy to rotate the slat positioning assembly (500). In some embodiments, the ratcheting mechanism (610) allows for winding the spring coil (620) in a manner to avoid overwinding.

In some embodiments, a sound emitter (910) located in the housing (200) is operatively connected to the microprocessor (760). In some embodiments, upon receiving a signal from the microprocessor (760), the sound emitter (910) emits a sound. In some embodiments, operating power is supplied to the sound emitter (910) via the power supply (800), via the microprocessor (760). In some embodiments, the sound from the sound emitter (910) is an alarm sound. In some embodiments, the sound from the sound emitter (910) is music, for example background music. In some embodiments, the sound from the sound emitter (910) is a voice, for example from an intercom system.

In some embodiments, a light emitter (900) located in the housing (200) is operatively connected to the microprocessor (760). In some embodiments, upon receiving a signal from the microprocessor (760), the light emitter (900) emits light. In some embodiments, operating power is supplied to the light emitter (900) via the power supply (800), via the microprocessor (760). In some embodiments, the light from the light emitter (900) is an emergency light. In some embodiments, the light from the light emitter (900) is a night light. In some embodiments, the light from the light emitter (900) is a standard light for room illumination. In some embodiments, the light from the light emitter (900) flashes.

In some embodiments, the light emitter (900) comprises a light emitting diode. In some embodiments, the light emitter (900) comprises a fluorescent light unit. In some embodiments, the light emitter (900) comprises an incandescent light bulb. In some embodiments, the light emitter (900) comprises a xenon light unit. In some embodiments, the light emitter (900) comprises a halogen light unit.

In some embodiments, a manual slat positioner (510) is located on the housing (200). In some embodiments, the manual slat positioner (510) is operatively connected to the slat positioning assembly (500) via the slat positioner gear (534). In some embodiments, the slat positioner gear (534) is disposed on the main shaft (530) proximal to the main shaft first end (532). In some embodiments, the manual slat positioner (510) is operatively connected to the main shaft (530) via the slat positioner gear (534). In some embodiments, the manual slat positioner (510) engages a ratcheting mechanism operatively coupled to the main shaft (530). In some embodiments, the ratcheting mechanism is operatively coupled to the slat positioner gear (534). In some embodiments, the ratcheting mechanism allows the main shaft (530) to rotate independent of the manual slat positioner (510) using standard will know practices.

In some embodiments, the system (100) comprises a plurality of slats (400) that can be rotated, located in the housing perimeter wall (210). In some embodiments, in the fully closed position, a first slat first side edge (430) closely approaches a second slat second side edge (440) without interfacing. In some embodiments, a divider is positioned between the first slat first side edge (430) and the second slat second side edge (440). In some embodiments, in the fully closed position, a first slat first side edge (430) closely approaches the divider without interfacing. In some embodiments, in the fully closed position, a second slat second side edge (440) closely approaches the divider without interfacing.

In some embodiments, the system (100) comprises four slats (400). In some embodiments, the system (100) comprises three slats (400). In some embodiments, the system (100) comprises two slats (400). In some embodiments, the system comprises more than four slats (400).

In some embodiments, the slats (400) traverse the housing perimeter wall (210) in a series. In some embodiments, the slats (400) are operatively coupled together via a slat positioning wheel (480), a drive belt (550), and a main shaft positioning wheel (540). In some embodiments, in the fully open position, the slats (400) allow airflow. In some embodiments, in the fully closed position, the slats (400) inhibit airflow. In some embodiments, in a position between the fully open position and the fully closed position (partially open), the slats (400) allow an inhibited rate of airflow.

In some embodiments, the power supply (800) is a rechargeable battery (810).

In some embodiments, the system (100) comprises a user interface (762) located in the housing (200). In some embodiments, the user interface (762) is operatively connected to the microprocessor (760). In some embodiments, the user interface (762) comprises a keypad. In some embodiments, the user interface (762) comprises an infrared sensor. In some embodiments, the user interface (762) comprises an alphanumeric display. In some embodiments, the user interface (762) is a liquid crystal display. In some embodiments, the user interface (762) comprises light emitting diodes.

In some embodiments, the system (100) comprises a thermostat (764) located in the housing (200). In some embodiments, the thermostat (764) is operatively connected to the microprocessor (760). In some embodiments, the thermostat controls the louver system (100) on which it is located. In some embodiments, the user interface (762) comprises a thermostat (764). In some embodiments, the local control system (750) comprises a thermostat (764).

In some embodiments, the slat positioning assembly (500) is coupled to the winding assembly (650). In some embodiments, upon receiving an activation signal via the microprocessor (760), solenoid actuator (570) and engagement tip (580) can disengage from the slat positioning gear (560) to allow the slat (400) to spin freely via the airflow that passes through the housing (200). In some embodiments, upon spinning freely, the slat (400) activates the winding assembly (650) to wind the mainspring assembly (600). In some embodiments, the slat (400) rotates in a direction opposite to the specific rotational direction of operation for slat (400) positioning in order to wind the mainspring assembly (600).

In some embodiments, a plurality of adjustable louvers (300) are located on the mounting fascia (240) and are able to be rotated. In some embodiments, the louvers (300) are coupled together and operate as a single unit.

In some embodiments, the housing (200) is generally rectangular. In some embodiments, the housing perimeter wall (210) is generally rectangular. In some embodiments, the housing (200) is generally circular or elliptical. In some embodiments, the housing perimeter wall (210) is generally circular or elliptical.

In some embodiments, the housing (200) comprises a power supply status indicator located thereon.

In some embodiments, the slat (400) comprises a curved shaped slat first surface (450) or slat second surface (460). In some embodiments, the slat (400) comprises a curved shaped slat third surface (462) or slat fourth surface (464).

In some embodiments, a cross-section of the slat (400) in a sagittal plane is "S" shaped. In some embodiments, a cross-section of the slat (400) in a sagittal plane is "C" shaped. In some embodiments, a cross-section of the slat (400) in a sagittal plane is "0" shaped. In some embodiments, a cross-section of the slat (400) in a sagittal plane is "I" shaped. In some embodiments, a cross-section of the slat (400) in a sagittal plane is "X" shaped.

In some embodiments, the slat first end (410) comprises a bearing (470). In some embodiments, the slat second end (420) comprises a bearing (470). In some embodiments, the slat first end (410) is located in the housing perimeter wall (210) via the bearing (470) and able to be rotated. In some embodiments, the slat second end (420) is located in the housing perimeter wall (210) via the bearing (470) and able to be rotated.

In some embodiments, the local control system (750) is operatively connected to a remote system (752). In some embodiments, the receiver (780) of the local control system (750) receives a signal from the remote system (752). In some embodiments, the transmitter (770) of the local control system (750) sends a signal to the remote system (752). In some embodiments, the signal is sent via radio spectrum. In some embodiments, the remote system (752) is a central heat and air conditioning (HVAC) system for a building.

In some embodiments, the local control system (750) is operatively connected to a remote system (752). In some embodiments, the receiver (780) of the local control system (750) receives a signal from the remote system (752). In some embodiments, the transmitter (770) of the local control system (750) sends a signal to the remote system (752). In some embodiments, the signal is sent via infrared spectrum. In some embodiments, the remote system (752) is a central heat and air conditioning (HVAC) system for a building.

In some embodiments, the local control system (750) is operatively connected to a remote system (752). In some embodiments, the receiver (780) of the local control system (750) receives a signal from the remote system (752). In some embodiments, the transmitter (770) of the local control system (750) sends a signal to the remote system (752). In some embodiments, the signal is sent via analog signals or digital signals through the metal duct work. In some embodiments, the signal is send via digital signals riding on analog waves through the metal duct work. In some embodiments, the remote system (752) is a central heat and air conditioning (HVAC) system for a building.

In some embodiments, the local control system (750) comprises a wireless network communication card (766) operatively connected thereto. In some embodiments, the local control system (750) can be operated via a computer, or a mobile phone. In some embodiments, the local control system (750) is connected via wires, for example, an Ethernet (network) cable. In some embodiments, the local control system (750) comprises a communications port (768) operatively connected thereto.

In some embodiments, a plurality of louver systems (100) is used. In some embodiments, the plurality of louver systems (100) is operated by the remote system (752). In some embodiments, the plurality of louver systems (100) is operated by the local control system (750) of a master louver system (100).

In some embodiments, the housing (200) comprises a plurality of mounting apertures (250). In some embodiments, the housing (200) mounts to and interfaces with a duct (110) via fasteners (260) located through the mounting apertures (250).

As used herein, the term "about" refers to plus or minus 10% of the referenced number. For example, an embodiment wherein the device is about 10 inches in length includes a device that is between 9 and 11 inches in length.

The disclosures of the following U.S. Patents are incorporated in their entirety by reference herein: U.S. Pat. Pub. 2004/0159713, U.S. Pat. Pub. 2006/0286918, U.S. Pat. Pub. 2007/0202794, U.S. Pat. No. 6,053,809, U.S. Pat. No. 7,522,063.

Various modifications of the invention, in addition to those described herein, will be apparent to those skilled in the art from the foregoing description. Such modifications are also intended to fall within the scope of the appended claims. Each reference cited in the present application is incorporated herein by reference in its entirety.

Although there has been shown and described the preferred embodiment of the present invention, it will be readily apparent to those skilled in the art that modifications may be made thereto which do not exceed the scope of the appended claims. Therefore, the scope of the invention is only to be limited by the following claims.

The reference numbers recited in the below claims are solely for ease of examination of this patent application, and are exemplary, and are not intended in any way to limit the scope of the claims to the particular features having the corresponding reference numbers in the drawings,

FIELD OF THE INVENTION

The present invention is directed to smoke detectors, more particularly to an improved smoke detector comprising a plurality of modules for storing various items.

BACKGROUND OF THE INVENTION

Standard smoke detectors can be found in every home and building. The present invention features an improved smoke detector device. The smoke detector device can be mounted on a wall or ceiling including but not limited to an existing electrical fixture/box. The smoke detector device comprises a mountable base around which a ring-like structure can be attached. The ring-like structure may comprise a plurality of interconnecting modules, each module adapted to hold an item such as a smoke detector component, a speaker, a wireless network card, a camera, and/or the like. The ring-like structure provides versatility to the smoke detector device.

Any feature or combination of features described herein are included within the scope of the present invention provided that the features included in any such combination are not mutually inconsistent as will be apparent from the context, this specification, and the knowledge of one of ordinary skill in the art. Additional advantages and aspects of the present invention are apparent in the following detailed description and claims.

SUMMARY

The present invention features an improved smoke detector device. In some embodiments, the device of the present invention comprises an elongated base having a top end and a generally hollow inner cavity (and optionally a bottom end, the bottom end functioning as an electrical box for example); a top aperture disposed in the top end of the base for providing access to the inner cavity of the base via the top end; a first groove disposed in an outer surface of the base, a third groove disposed in the outer surface of the base below the top end of the base, and a second groove disposed in the outer surface of the base in between the first groove and the third groove; a first flange extending outwardly from the outer surface of the base in between the first groove and the second groove, a second flange extending outwardly from the outer surface of the base in between the second groove and the third groove, and a third flange extending outwardly from the outer surface of the base above the third groove at the top end of the base; a first ring for wrapping around the first groove, a second ring for wrapping around the second groove, and a third ring for wrapping around the third groove; a first base wire opening is disposed in the first groove, a second base wire opening is disposed in the second groove, and a third base wire opening is disposed in the third groove; and a first module wire opening disposed in the first ring, a second module wire opening disposed in the second ring, and a third module wire opening disposed in the third ring, wherein the first base wire opening can be aligned with the first module wire opening, the second base wire opening can be aligned with the second module wire opening, and the third base wire opening can be aligned with the third module wire opening so as to allow a wire from the inner cavity of the base to be directed into the respective ring.

In some embodiments, the base is divided into an outer telescopic portion comprising the first groove and the first flange, a middle telescopic portion comprising the second groove and the second flange, and an inner telescopic portion comprising the third groove and the third flange, the middle telescopic portion can slide into the outer telescopic portion until the second flange and first flange contact each other, and the inner telescopic portion can slide into the middle telescopic portion until the second flange and third flange contact each other.

In some embodiments, a middle telescopic portion lip is disposed around an outer bottom edge of the middle telescopic portion of the base and an inner telescopic portion lip is disposed around an outer bottom edge of the inner telescopic portion of the base.

In some embodiments, the first flange juts inwardly toward the inner cavity of the base creating a first flange lip and the second flange juts inwardly toward the inner cavity of the base creating a second flange lip, wherein the first flange lip helps prevent the middle telescopic portion from being detached from the outer telescopic portion by blocking upward movement of the middle telescopic portion lip past the first flange lip, and the second flange lip helps prevent the inner telescopic portion from being detached from the middle telescopic portion by blocking upward movement of the inner telescopic portion lip past the second flange lip.

In some embodiments, the device further comprises a first set screw disposed in the first groove in the outer telescopic portion of the base a first distance below the first flange, the first set screw can rotate in a first direction and a second direction respectively moving the first set screw inwardly into the inner cavity of the base and outwardly away from the inner cavity of the base, wherein when the middle telescopic portion of the base is slid upwardly out of the outer telescopic portion and the first set screw is rotated in the first direction into the inner cavity of the base, the first set screw and first flange sandwich the middle telescopic portion lip to secure the middle telescopic portion out of the outer telescopic portion and when the first set screw is rotated in the second direction away from the inner cavity of the base the middle telescopic portion lip is not sandwiched between the first flange and first set screw and the middle telescopic portion slides into the outer telescopic portion.

In some embodiments, the device further comprises a second set screw disposed in the second groove in the middle telescopic portion of the base a second distance below the second flange, the second set screw can rotate in a first direction and a second direction respectively moving the second set screw inwardly into the inner cavity of the base and outwardly away from the inner cavity of the base, wherein when the inner telescopic portion of the base is slid upwardly out of the middle telescopic portion and the second set screw is rotated in the first direction into the inner cavity of the base, the second set screw and second flange sandwich the inner telescopic portion lip to secure the inner telescopic portion out of the middle telescopic portion and when the second set screw is rotated in the second direction away from the inner cavity of the base, the inner telescopic portion lip is not sandwiched between the second flange and second set screw and the inner telescopic portion is able to slide into the middle telescopic portion.

In some embodiments, the device further comprises an inner ring groove disposed in the first ring at an intersection of a top surface of the first ring and an inner cavity of the first ring, wherein the inner ring groove wraps around the first flange, second flange, and third flange when the first ring is wrapped around the first groove when the middle telescopic portion is in the outer telescopic portion and the inner telescopic portion is in the middle telescopic portion.

In some embodiments, the base is generally cylindrical in shape. In some embodiments, the grooves are generally ring-shaped. In some embodiments, each ring can pivot between an open position and a closed position via a second hinge mechanism so as to be fitted onto its respective groove. In some embodiments, the device further comprises a locking mechanism for securing each ring in the closed position. In some embodiments, the device further comprises a release button connected to the locking mechanism for unlocking the locking mechanism.

In some embodiments, one or more rings comprises at least two modules, each module comprising an inner chamber and a door, the inner chamber of each module can hold an item, the door of each module can move between an open position and a closed position for respectively allowing and preventing access to the inner chamber of the module. In some embodiments, the modules can removably connect together via a connecting means (e.g., a hinge mechanism, a locking mechanism, an assembly clip, a clamp, a snap, an adhesive, a hook-and-loop fastener, or a combination thereof).

In some embodiments, the base further comprises a bottom end 112 (e.g., an electrical box). In some embodiments, a fixture can be mounted to the base 110-1 via a mounting means 130 disposed on the base 110-1 at the top end 111. In some embodiments, the mounting means 130 includes a mounting hole adapted to receive a screw, bolt, or nail, or an adhesive.

In some embodiments, the device of the present invention comprises a base; and a ring for removably attaching to the base, the ring comprising at least two modules that removably connect together via a connecting means to form the ring, wherein each module comprises an inner chamber and a door, the inner chamber of each module can hold an item, the door of each module can move between an open position and a closed position for respectively allowing and preventing access to the inner chamber of the module.

In some embodiments, the smoke detector device is mounted to an existing electrical fixture on the wall or ceiling. In some embodiments, the place on the ceiling or the wall is aligned with a beam or joist. In some embodiments, the base is generally cylindrical in shape. In some embodiments, a top aperture is disposed in a top end of the base for providing access to an inner cavity of the base. In some embodiments, the device further comprises a groove disposed in the base.

In some embodiments, the mounting means includes a mounting hole disposed in the base at the top end wherein the mounting hole is adapted to receive a screw, bolt, or nail, or an adhesive. In some embodiments, the mounting holes are positioned at edges of the top aperture. In some embodiments, a portion of the base at a bottom end can be temporarily removed for allowing access to the inner cavity of the base. In some embodiments, the ring can wrap around the groove of the base. In some embodiments, the device further comprises four or more modules.

In some embodiments, the connecting means includes a hinge mechanism, a locking mechanism, an assembly clip, a clamp, a snap, an adhesive, a hook-and-loop fastener, or a combination thereof. In some embodiments, the device further comprises a release button connected to the locking mechanism for unlocking the locking mechanism.

In some embodiments, the item is operatively connected to a power source, the power source including a battery or an electrical system of an existing electrical fixture. In some embodiments, a base wire opening is disposed in the groove of the base and a module wire opening is disposed in the module, the base wire opening can be aligned with the module wire opening so as to allow a wire from the inner cavity of the base to be directed into the module.

In some embodiments, the ring comprises at least two steel support rods spanning the ring from a first side to a second side, the steel support rods generally parallel to each other. In some embodiments, the steel support rods snugly fit around the base. In some embodiments, the steel support rods each have a first end and a second end, the first end having a first mounting hole and the second end having a second mounting hole.

DESCRIPTION OF PREFERRED EMBODIMENTS

Referring now to FIG. 10-21, the present invention features an improved smoke detector device 100-1. The smoke detector device 100-1 comprises a plurality of interconnecting modules (forming a ring-like structure around a central base) for storing various items, increasing the versatility of the smoke detector device 100-1.

Figure 12:
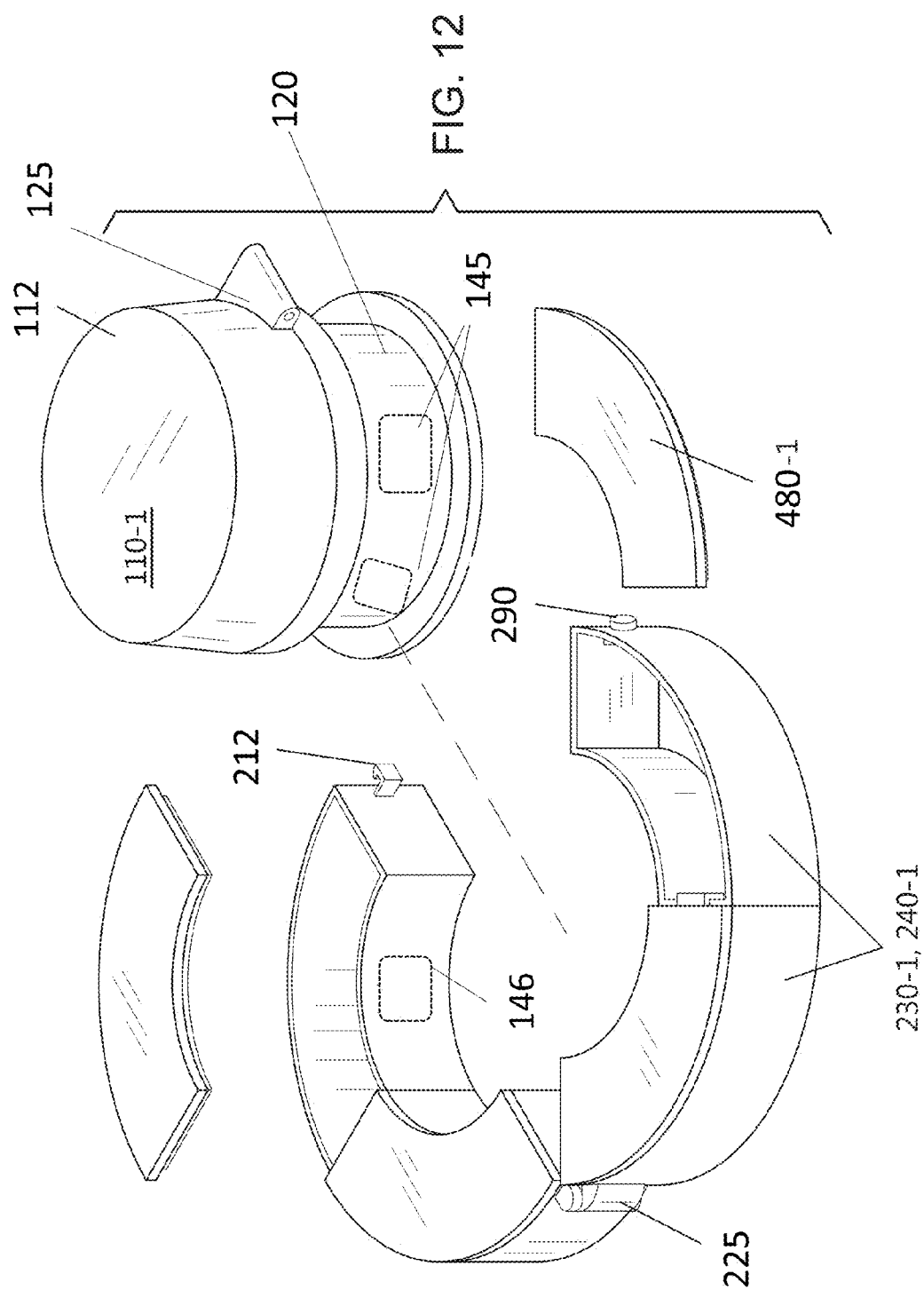
FIG. 12 is a second exploded view of the smoke alarm device of FIG. 10.
Figure 13:
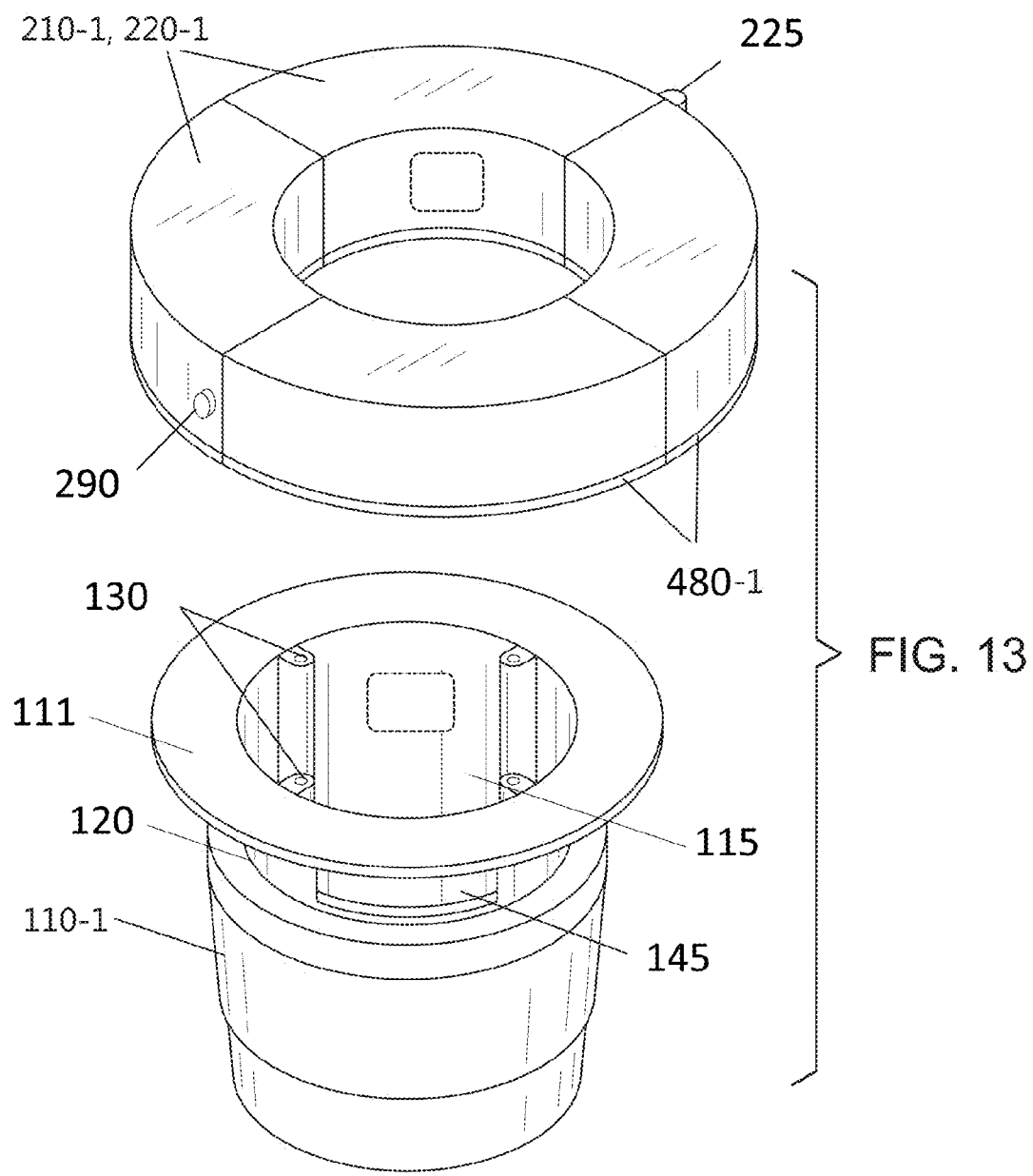
FIG. 13 is a third exploded view of the smoke alarm device of FIG. 10.

As shown in FIG. 12 and FIG. 13, the smoke detector device 100-1 comprises a base 110-1 for mounting on a wall or ceiling. The smoke detector device 100-1 may be mounted to a place on the wall or ceiling that is aligned with a beam or joist. In some embodiments, the smoke detector device 100-1 is mounted to (and in some cases connected to) an existing electrical fixture/box (e.g., a light fixture). For example, the wire components of the existing electrical fixture may be used by the smoke detector device 100-1 or by both the existing electrical fixture and the smoke detector device 100-1. In some embodiments, the smoke detector device 100-1 does not utilize the wire components of the existing electrical fixture/box. For example, the smoke detector device 100-1 is operatively connected to a battery power source, eliminating the need to be operatively connected to wire components of an existing electrical fixture.

The base 110-1 has an inner cavity, a top end 111, and a bottom end 112. In some embodiments, the base 110-1 is generally cylindrical in shape. As used herein, the term "top end" may refer to either the top or bottom of the base 110-1.

As used herein, the term "bottom end" may refer to either the top or bottom of the base 110-1. For example, the top end 111 of the base 110-1 may be the portion that is visible if a user looks up toward the ceiling and the bottom end 112 of the base 110-1 may be attached to the ceiling, or vice versa. Disposed in the top end 111 of the base 110-1 is a top aperture 115. In some embodiments, electrical wires, for example wires from the existing electrical fixture, may be inserted into the inner cavity of the base 110-1 via the top aperture 115. In some embodiments, a groove 120 is disposed in the base 110-1, for example near the top end 111. In some embodiments, the bottom end 112 is a cap or an electrical box.

Disposed in the base 110-1 (e.g., in the inner cavity of the base 110-1) at the top end 111 of the base 110-1 is one or more mounting holes 130 adapted to receive screws, bolts, nails, and the like. The mounting holes 130 allow a light fixture or other fixture to be attached to the base 110-1. The base 110-1 may be attached to the wall or ceiling such that the bottom end 112 of the base is embedded in the ceiling or wall or the bottom end 112 of the base 110-1 is generally flush with the wall or ceiling. The screws, bolts, and/or nails can be driven through the mounting holes 130. In some embodiments, the mounting holes 130 are positioned at edges of the top aperture 115 (see FIG. 13).

Figure 17:
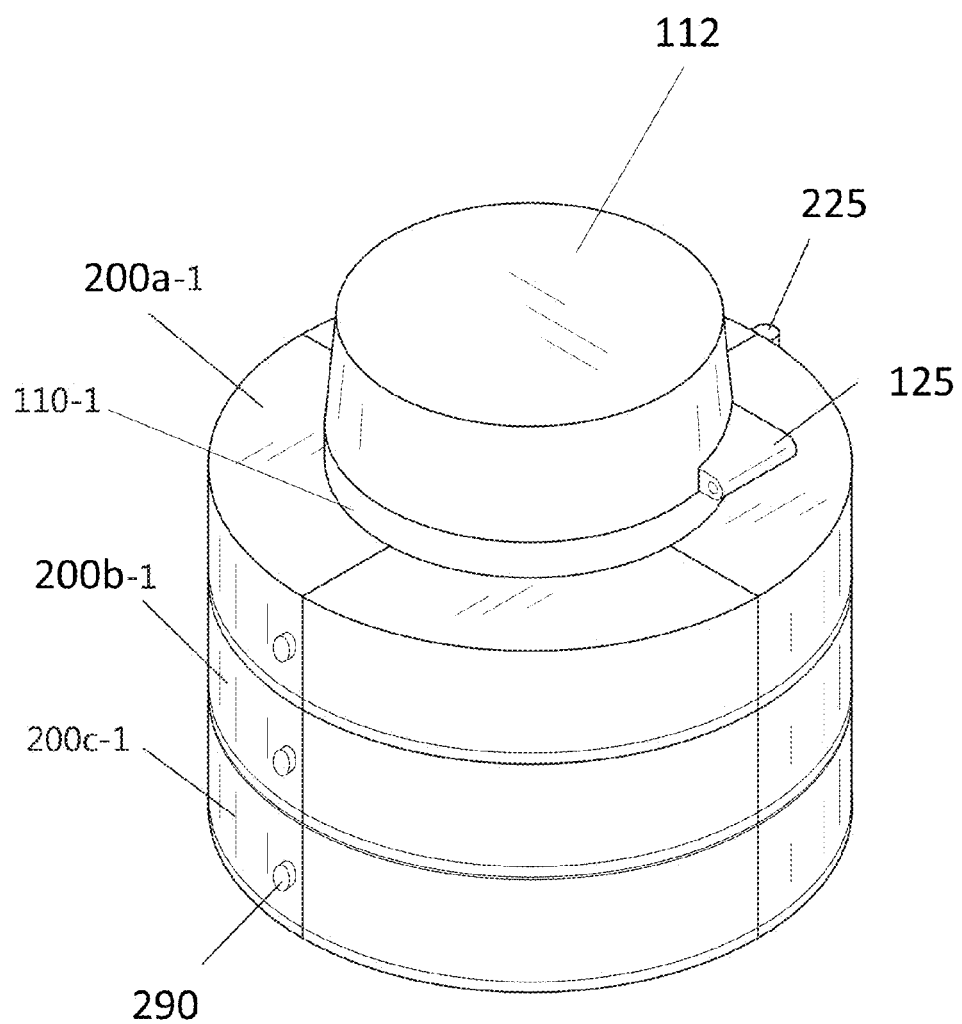
FIG. 17 is a bottom perspective view of the device of FIG. 16, wherein the rings are engaged in the respective grooves.
Figure 18:
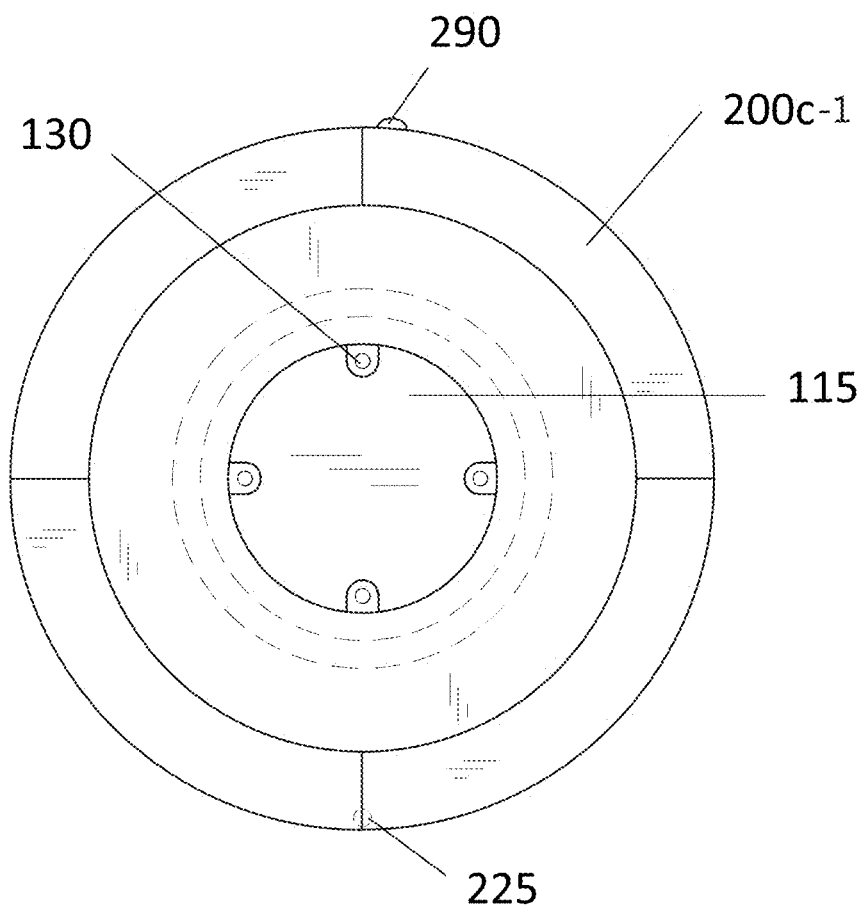
FIG. 18 is a top view of the device of FIG. 17.
Figure 19:
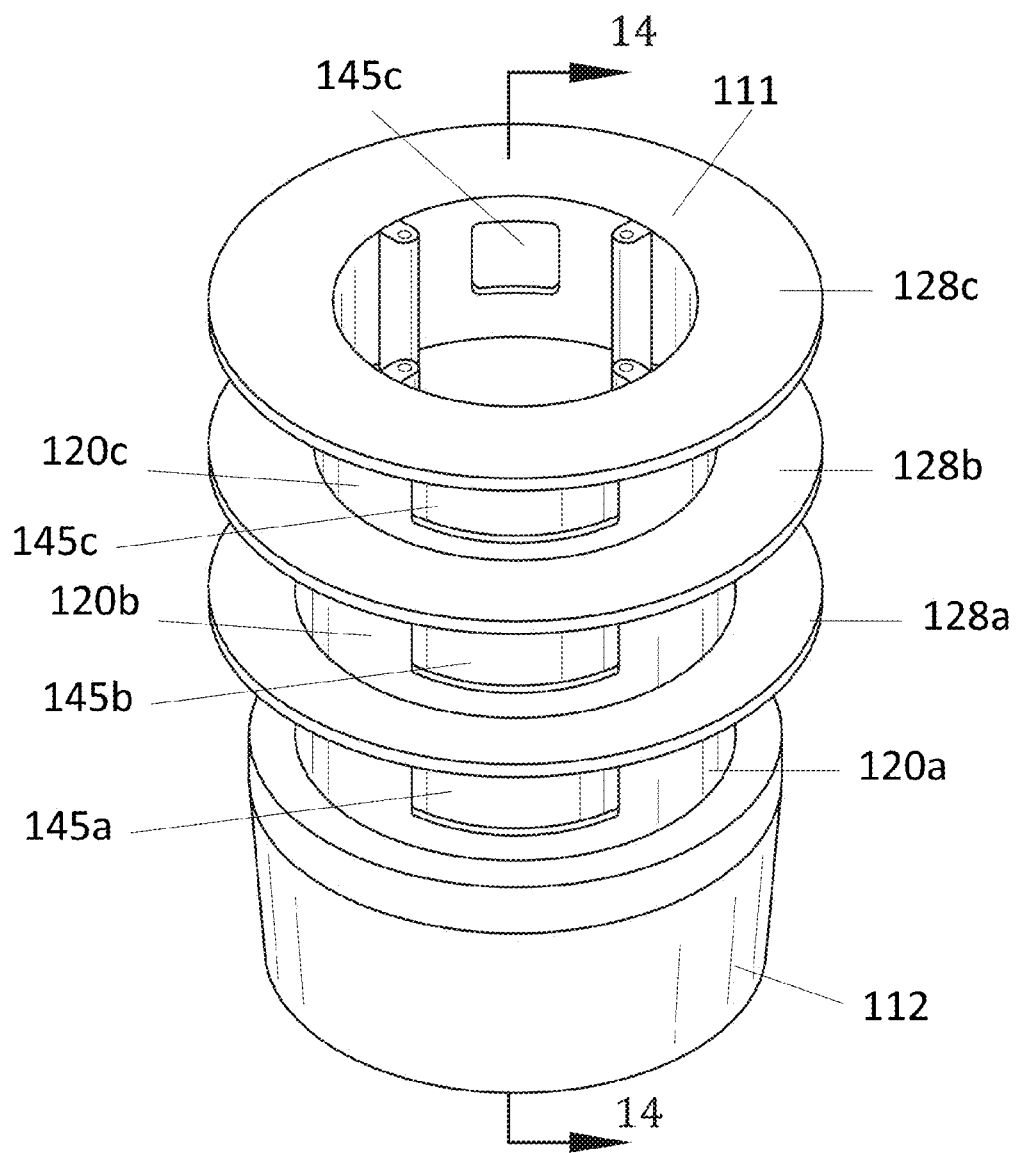
FIG. 19 is a top perspective view of the device of the present invention, wherein the device is in the expanded position. The rings are not engaged in the grooves.
Figure 20:
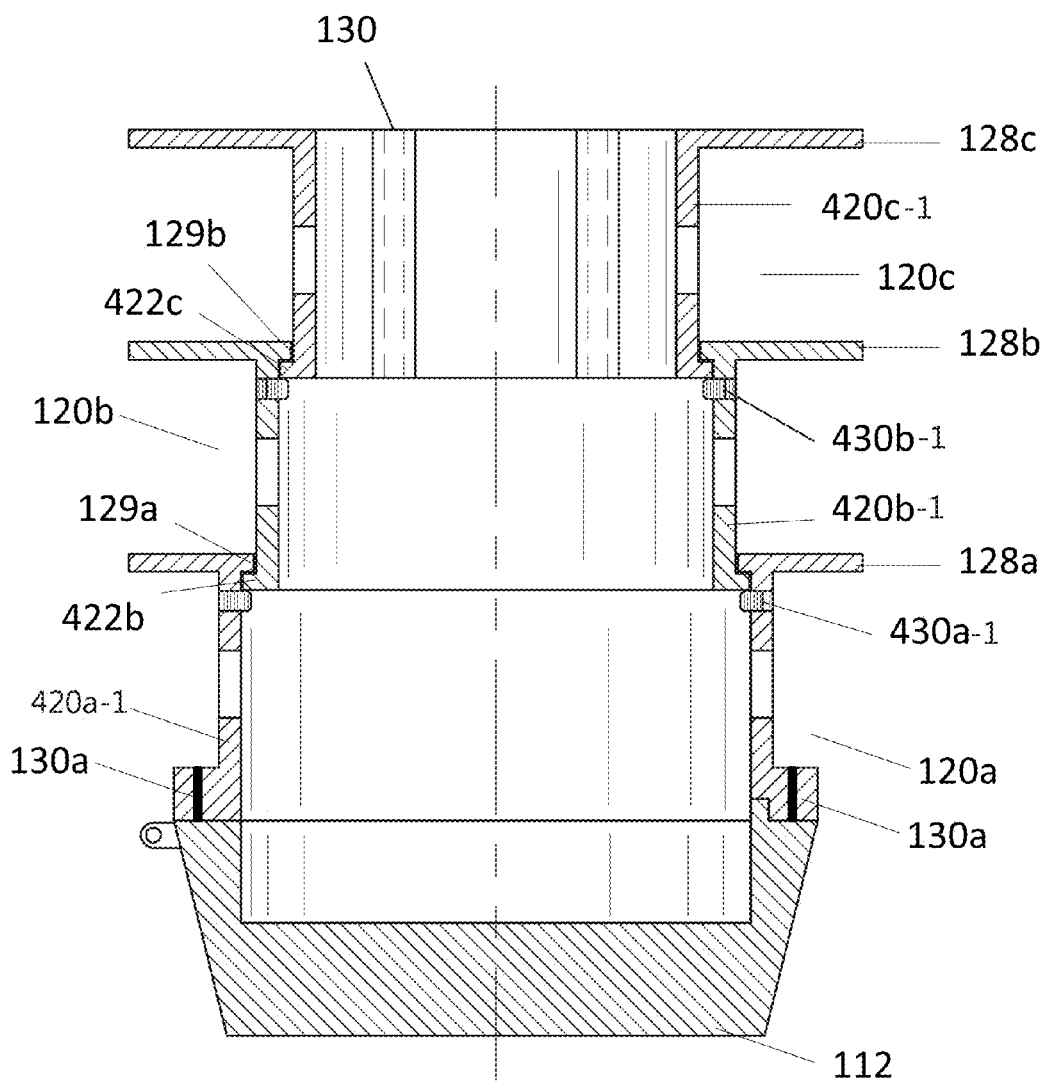
FIG. 20 is a first side cross sectional view of the device of FIG. 17, wherein the device is in the collapsed position.

In some embodiments, the bottom end 112 (e.g., cap, electrical box) or a portion of the base 110-1 at the bottom end 112 functions as a removable cover, for example the bottom end 112 (or a portion of the base 110-1 at the bottom end 112) can be removed from the base 110-1 for allowing access to the inner cavity of the base 110-1. In some embodiments, the bottom end 112 of the base 110-1 is removed so a user can access to the mounting holes 130 and attach the base 110-1 to the wall or ceiling. In some embodiments, the bottom end 112 (e.g., cap, electrical box) or a portion of the base 110-1 at the bottom end 112 is removably attached to the base via an attachment means. For example, as shown in FIG. 20, the attachment means may include mounting slots 130*a* disposed in the base 110-1 at the connection between the base 110-1 and the second end 112. Nails, screws, and the like can be threaded through the mounting slots 130*a* to secure the second end 112 (e.g., electrical box) to the base 110-1, for example. In some embodiments, a first nail slot mechanism 125*a* is disposed on the base 110-1 and/or on the second end 112 (e.g., electrical box), as shown in FIG. 17. In some embodiments, the first nail slot mechanism 125*a* allows a user to attach the device to a ceiling and/or joist, for example by driving a nail or screw through the first nail slot mechanism 125*a*. In some embodiments, the attachment means is a first hinge mechanism 125.

In some embodiments, the base 110-1 lacks the bottom end 112 (e.g., electrical box). In some embodiments, the bottom end 112 of the base 110-1 (or a portion of the base 110-1 at the bottom end 112) can be removed and an alternative item can be attached to the base 110-1 in its place. For example, in some embodiments, a light or a speaker is installed in place of the bottom end 112 of the base 110-1. In some embodiments, if the smoke detector device 100-1 is connected to an existing electrical fixture/box, the existing electrical fixture can still function as it did previously before the smoke detector device 100-1 was added. As an example, if the smoke detector device 100-1 is connected to an existing light fixture box, a light can be installed in lieu of the bottom end 112 of the base 110-1, allowing the light fixture box to still function to support the light while simultaneously supporting the smoke detector device 100-1.

Figure 10:
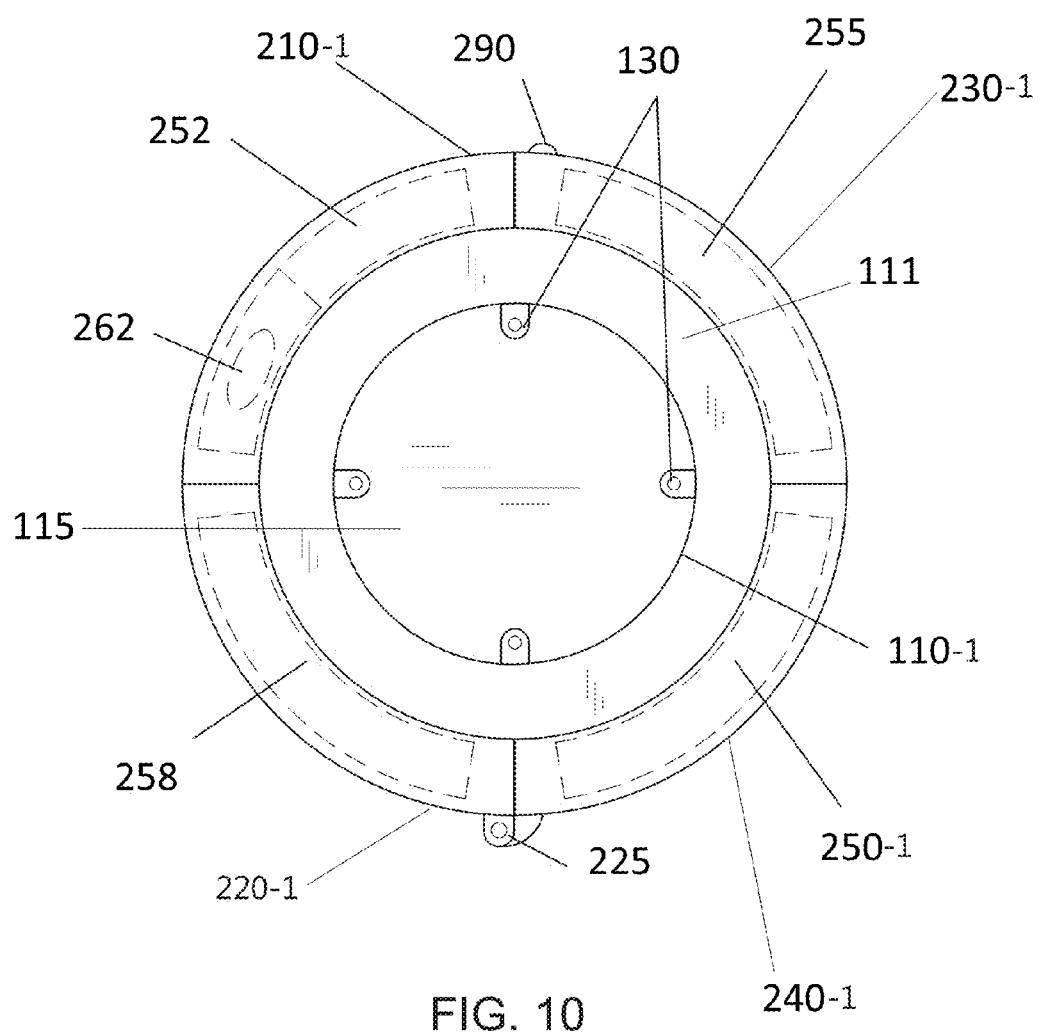
FIG. 10 is a top and internal view of a first embodiment of the smoke alarm device of the present invention.
Figure 11:
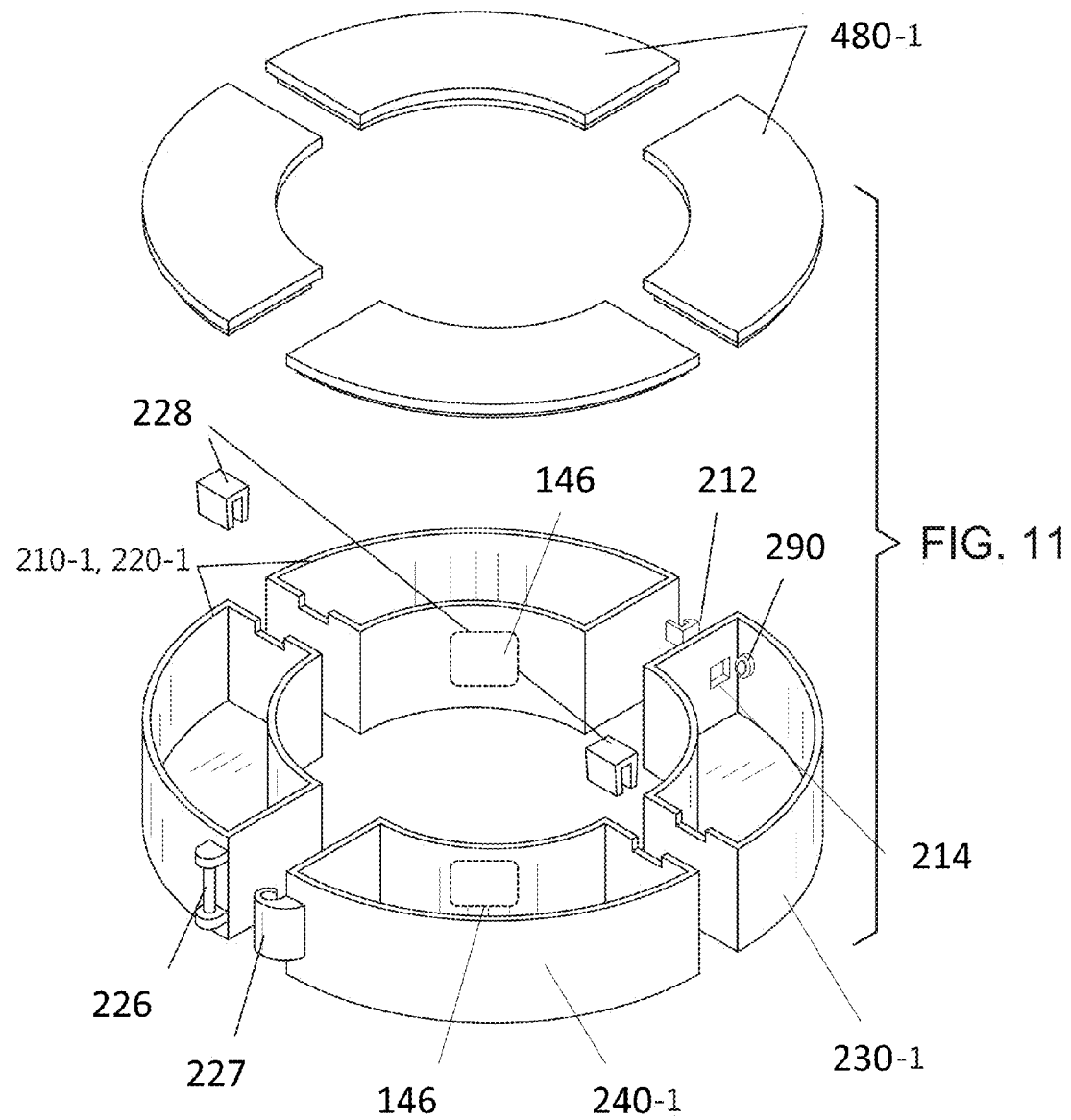
FIG. 11 is a first exploded view of the smoke alarm device of FIG. 10.

The smoke detector device 100-1 further comprises a ring 200-1 that can be removably attached to (e.g., wrapping around) the base 110-1. The ring 200-1 can move between an open and closed position so as to be fitted onto the base 110-1. In some embodiments, the ring 200-1 wraps around (e.g., snugly fits into) the groove 120 of the base 110-1. As shown in FIG. 10 and FIG. 11, the ring 200-1 may be generally circular in shape. The ring 200-1 is not limited to a standard circular ring shape. In some embodiments, the shape of the ring 200-1 is generally oval, rectangular or square, triangular, pentagonal, hexagonal, octagonal, trapezoidal, irregular, or the like. The ring 200-1 is not limited to the aforementioned shapes.

The ring 200-1 can pivot between an open position and a closed position, for example via a second hinge mechanism 225. The ring 200-1 may be divided into a first half ring and a second half ring, each half ring having a first end and a second end. The first end of the first half ring is pivotally attached to the first end of the second half ring, for example via the second hinge mechanism 225. The second hinge mechanism 225 may comprise hinge hook 227 disposed on the first end of the second half ring that engages (e.g., removably engages) a hinge rod 226 disposed on the first end of the first half ring. Hinge mechanisms are well known to one of ordinary skill in the art.

The second end of the first half ring may be locked to the second end of the second half ring to secure the ring 200-1 in the closed position. In some embodiments, a locking mechanism secures the ring 200-1 in the closed position. As an example, in some embodiments, a locking clip 212 is disposed on the second end of the first half ring. The locking clip 212 is for engaging a locking aperture 214 disposed in the second end of the second half ring. The locking clip 212 can snap into and out of the locking aperture 214. In some embodiments, a release button 290 is connected to the locking mechanism for unlocking the locking mechanism. For example, the release button 290 can move between a pressed position and a released position (the release button 290 may be biased in the released position, for example caused by a spring). When the release button 290 is in the pressed position, it pushes the locking clip 212 out of the locking aperture 214. Release buttons (e.g., spring-loaded buttons and the like) are well known to one of ordinary skill in the art.

The ring 200-1 is divided into one or more modules that connect together to form the ring via a connecting means. In some embodiments, the ring 200-1 is divided into two modules. In some embodiments, the ring 200-1 is divided into three modules. As shown in FIG. 10 and FIG. 11, in some embodiments, the ring 200-1 is divided into four modules, for example a first module 210-1, a second module 220-1, a third module 230-1, and a fourth module. The ring 200-1 is not limited to four modules, for example the ring 200-1 may comprise five, six, seven, eight, or more than eight modules. In some embodiments, the first module 210-1 and the second module 220-1 make up the first half ring. In some embodiments, the third module 230-1 and the fourth module 240-1 make up the second half ring.

As shown in FIG. 11, the modules can be separated from each other and put back together (e.g., via a connecting means) to reform the ring 200-1. In some embodiments, the second hinge mechanism 225 may be taken apart allowing the modules with the second hinge mechanism 225 to be separated. Separating the modules allows a user to modify the modules in the ring 200-1 as needed. For example, the user may have a ring 200-1 comprising two modules and wish to add more modules. He/she can replace one (or both)

of the original modules with different modules. As an example, a single large module can be replaced with two smaller modules that combined fit where the original module was within the ring 200-1.

Each module has a first end and a second end. As shown in FIG. 11, the first end of the first module 210-1 comprises the locking clip 212 and the second end of the third module comprises the locking aperture 214 and the release button 290. The second end of the second module 220-1 comprises the hinge rod 226 and the first end of the fourth module 240-1 comprises the hinge hook 227. The locking mechanism and the second hinge mechanism 225 may be considered connecting means. The modules can be connected together via additional connecting means. In some embodiments, the modules can be connected together via assembly clips 228 that snugly snap onto ends of two modules. For example, the second end of the first module 210-1 can be secured to the first end of the second module via an assembly clip 228. The connecting means is not limited to assembly clips, and may include other standard connecting means such as clamps, snaps, adhesives, hook-and-loop fasteners, the like, or a combination thereof.

Each module has an inner chamber for holding items. Each module comprises a door 480-1 that can open and close respectively allowing and preventing access to the inner chamber of the module.

The modules of the smoke detector device 100-1 can accept other devices in addition to a smoke detecting component 250-1 including but not limited to a wireless network card 252, a speaker 255 (e.g., music speakers), a camera 272 (e.g., surveillance camera), a battery 258 (e.g., a rechargeable battery), a light 262, or a combination thereof. In some embodiments, the speakers can receive audio signals wirelessly from a music system (e.g., a stereo system, a MP3 player, etc.). In some embodiments, the music system comprises a corresponding wireless module attached to its audio output (for example, the AUX output on the back of the stereo). In some embodiments, the speaker 255 can also be programmed (e.g., via a microprocessor) to broadcast certain messages, for example a warning message in the case of a fire.

If needed, items in the modules can be operatively connected to a power source. In some embodiments, the power source is a battery (e.g., rechargeable battery). In some embodiments, the power source is the electrical system of the existing electrical fixture. Wires can be directed from the wall or ceiling into the inner cavity of the base 110-1 (via the top aperture). In some embodiments, a base wire opening 145 is disposed in the base 110-1 (e.g., in the groove 120 of the base 110-1). Wires can be directed out of the inner cavity of the base 110-1 and into a module (e.g., via a module wire opening 146 in the module). The base wire opening 145 in the base 110-1 may be aligned with the module wire opening 146 of the module.

Figure 14:
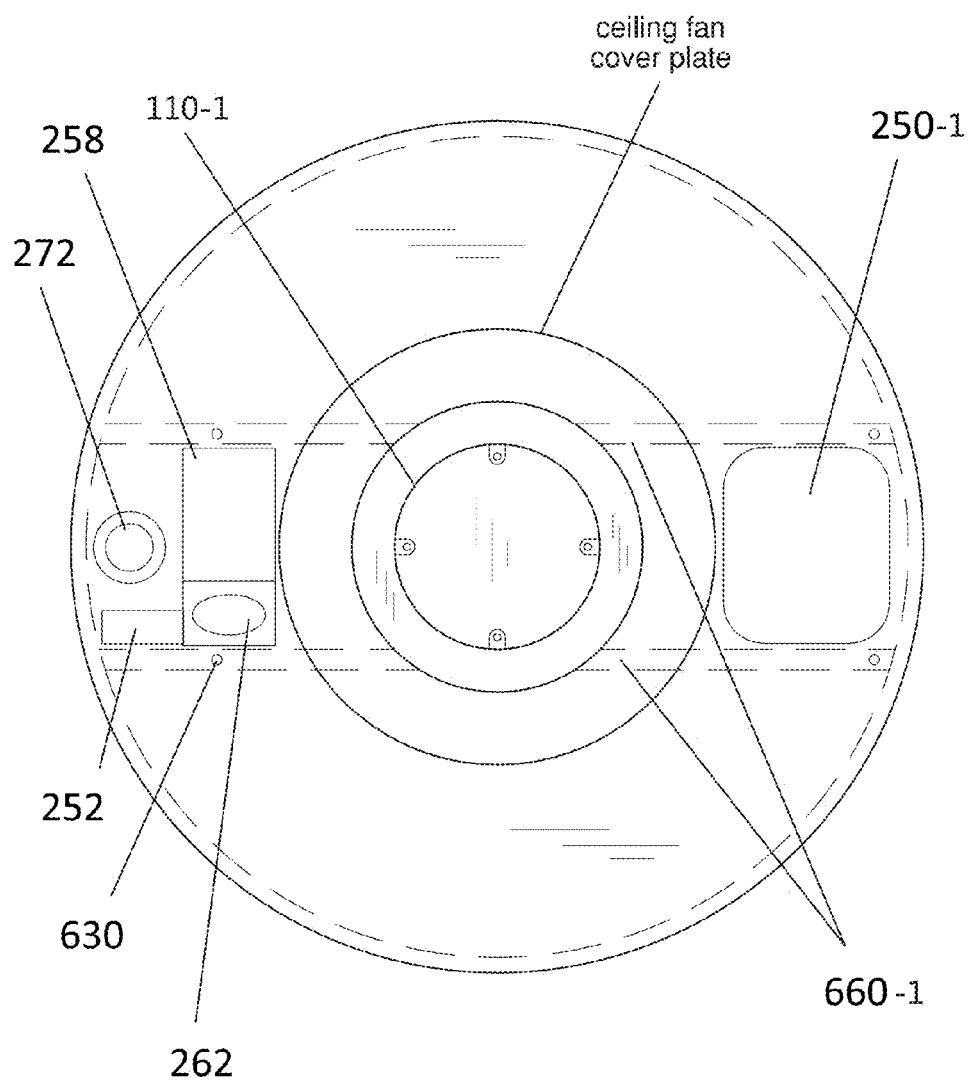
FIG. 14 is a top and internal view of a second embodiment of the smoke alarm device of the present invention.
Figure 15:
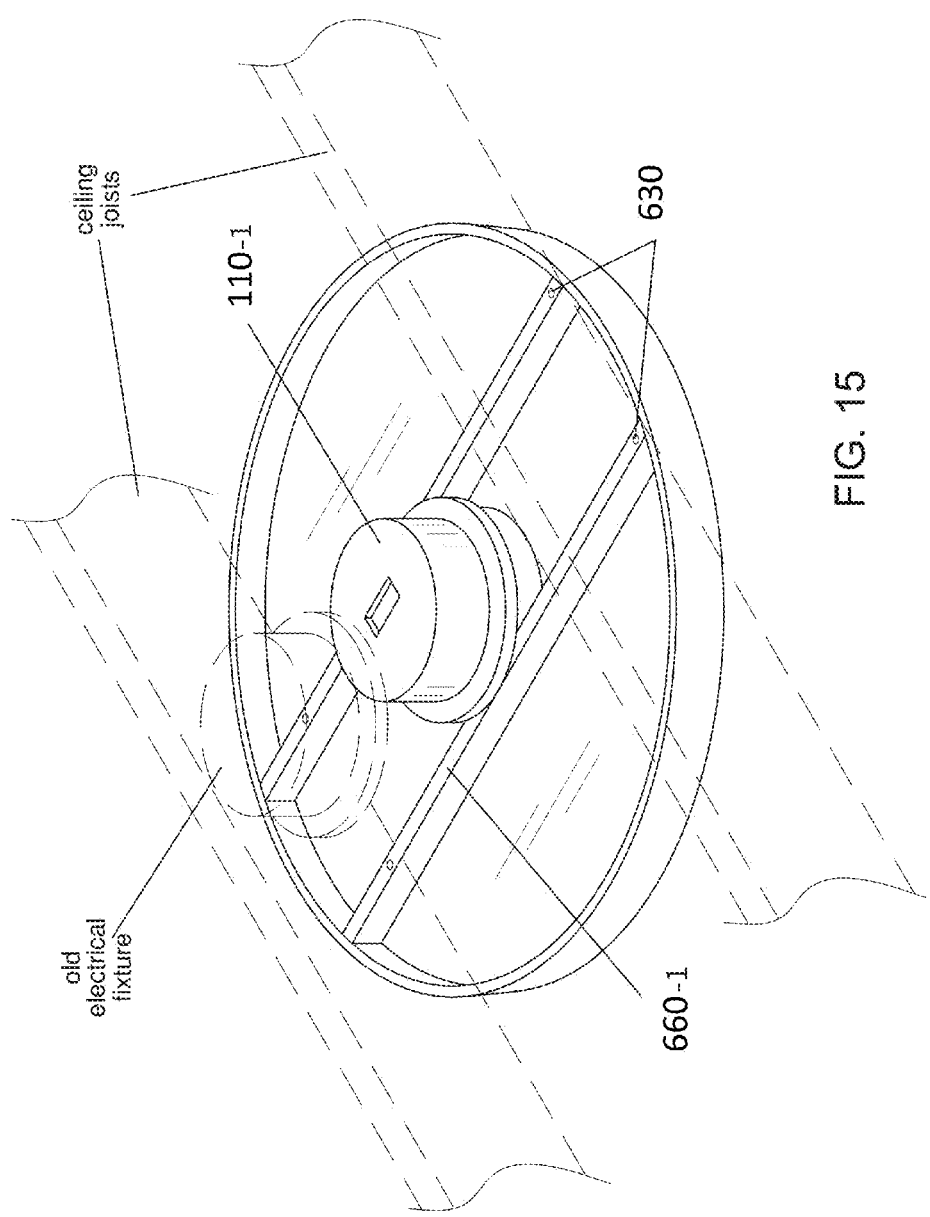
FIG. 15 is a perspective view of the smoke alarm device of FIG. 14.

As shown in FIG. 14 and FIG. 15, the ring 200-1 may comprise one or more (e.g., two) steel support rods for providing additional support when mounting the smoke detector device 100-1 to the wall or ceiling. The steel support rods 660-1 may run parallel to each other, spanning the ring from a first side to a second side. The steel support rods 660-1 may be positioned a certain distance apart so that the steel support rods 660-1 snugly fit around the base 110-1 (e.g., the groove 120 of the base 110-1). The steel support rods 660-1 have a first end and a second end, the first end having a first mounting hole 630 and the second end having a second mounting hole 630. The steel support rods are long enough to be attached to two beams or joists, for example the first end is aligned (e.g., perpendicularly aligned) with a first joist and the second end is aligned (e.g., perpendicularly aligned) with a second joist.

As shown in FIG. 14, in some embodiments, the steel support rods 660-1 and the base 110-1 combined form inner chambers that can hold various items including but not limited to a camera 272, a wireless network card 258, a light 262, a battery 252, and the smoke detector component 250-1.

In some embodiments, the smoke alarm component comprises a rechargeable battery than can be charged whenever the electrical fixture (e.g., light switch) is turned on. (The rechargeable battery may be operatively connected to the electrical fixture/wiring). This may eliminate the need for the user to replace the battery (which may require a possibly dangerous ascent up a ladder), as in current household smoke alarm designs. In some embodiments, the smoke detector component can alert the user when the battery needs charging via an alarm (beeping) or even a user-programmed voice message.

Figure 16:
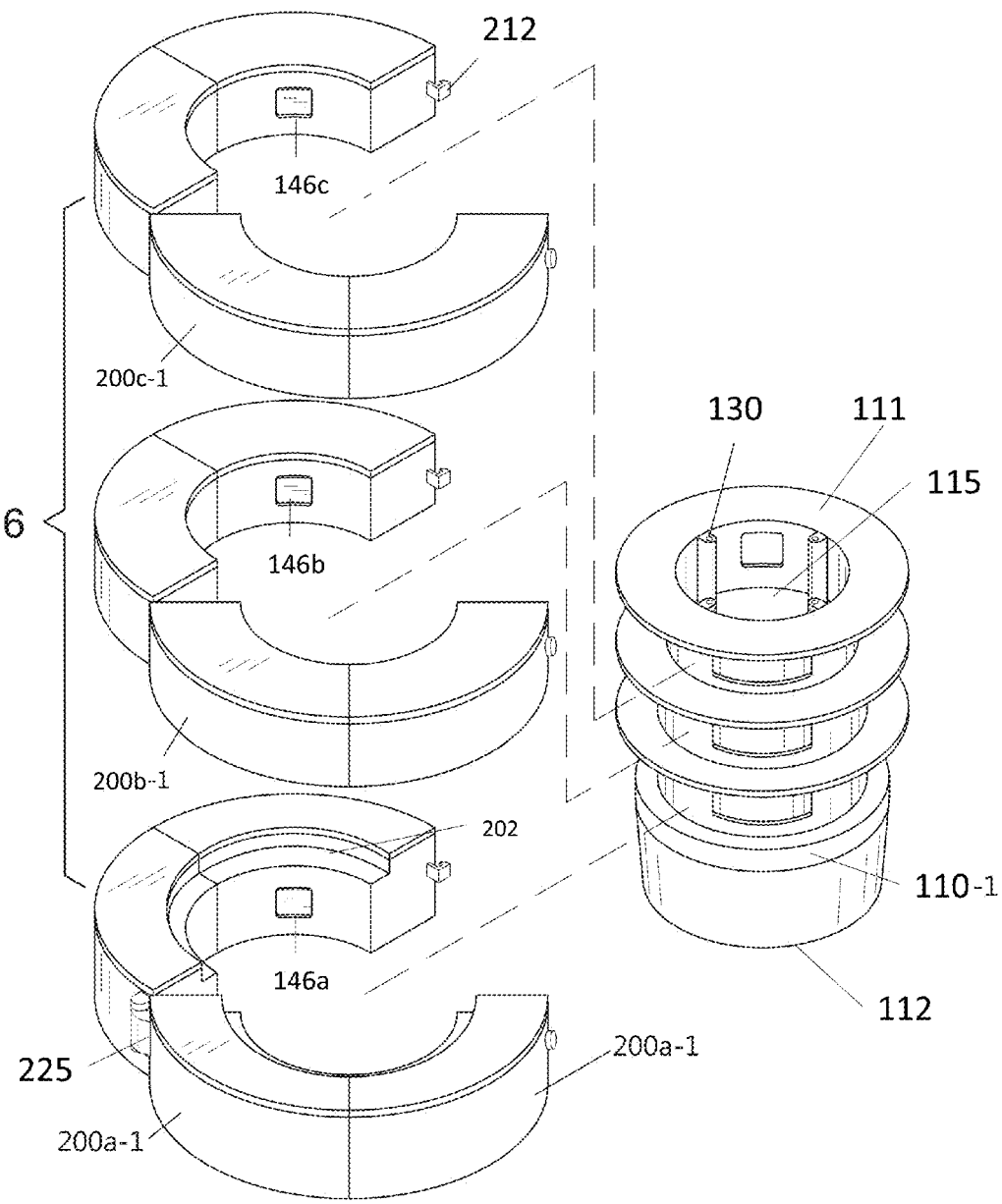
FIG. 16 is an exploded view of an alternative embodiment of the device of the present invention.

Referring now to FIG. 16-21, the smoke detector device 100-1 comprises a base 110-1 (e.g., a generally cylindrical base) having a top end 111 and a generally hollow inner cavity. In some embodiments, the base 110-1 comprises a bottom end 112 (e.g., electrical box, for example). As used herein, the term "top end" may refer to either the top or bottom of the base 110-1. As used herein, the term "bottom end" may refer to either the top or bottom of the base 110-1. For example, the top end 111 of the base 110-1 may be the portion that is visible if a user looks up toward the ceiling and the bottom end 112 of the base 110-1 may be attached to the ceiling, or vice versa. As shown in FIGS. 16 and 17, the base 110-1 may be generally elongated. Disposed in the top end 111 of the base 110-1 is a top aperture 115 providing access to the inner cavity of the base 110-1. In some embodiments, electrical wires, for example wires from the existing electrical fixture, may be inserted into the inner cavity of the base 110-1 via the top aperture 115.

Disposed along the base 110-1 (along the outer surface of the base 110-1) in between the top end 111 and the optional bottom end 112 (e.g., electrical box) is a first groove 120a, a second groove 120b, and a third groove 120c. The grooves 120 are indentations in the outer surface of the base 110-1. The grooves 120 are generally ring-shaped. The first groove 120a is positioned above the optional bottom end 112 (e.g., electrical box) of the base 110-1, the third groove 120c is positioned below the top end 111 of the base 110-1, and the second groove 120a is positioned in between the first groove 120a and the third groove 120c.

In some embodiments, a first flange 128a extends outwardly from the outer surface of the base 110-1 in between the first groove 120a and the second groove 120b. In some embodiments, a second flange 128b extends outwardly from the outer surface of the base 110-1 in between the second groove 120b and the third groove 120c. In some embodiments, a third flange 128c is disposed at the top end 111 of the base 110-1 above the third groove 120c (e.g., the top end 111 of the base forms the first flange 128c).

Figure 21:
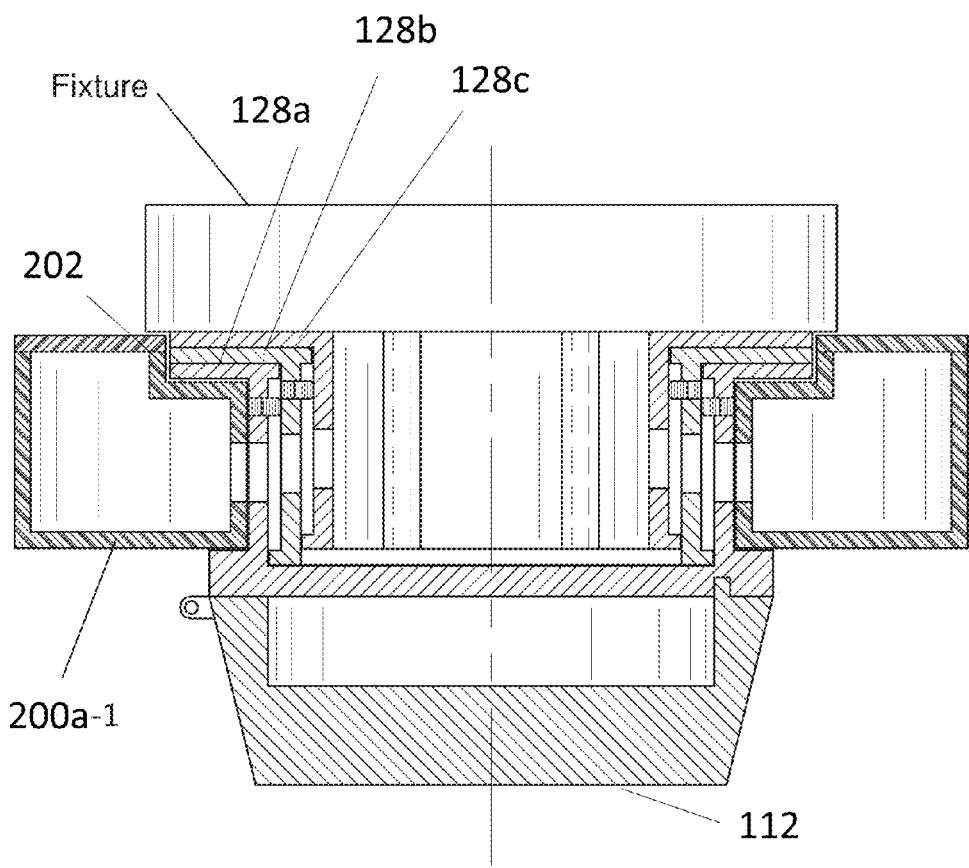
FIG. 21 is a second side cross sectional view of the device of FIG. 17, wherein the device is in the expanded position.
Figure 22:
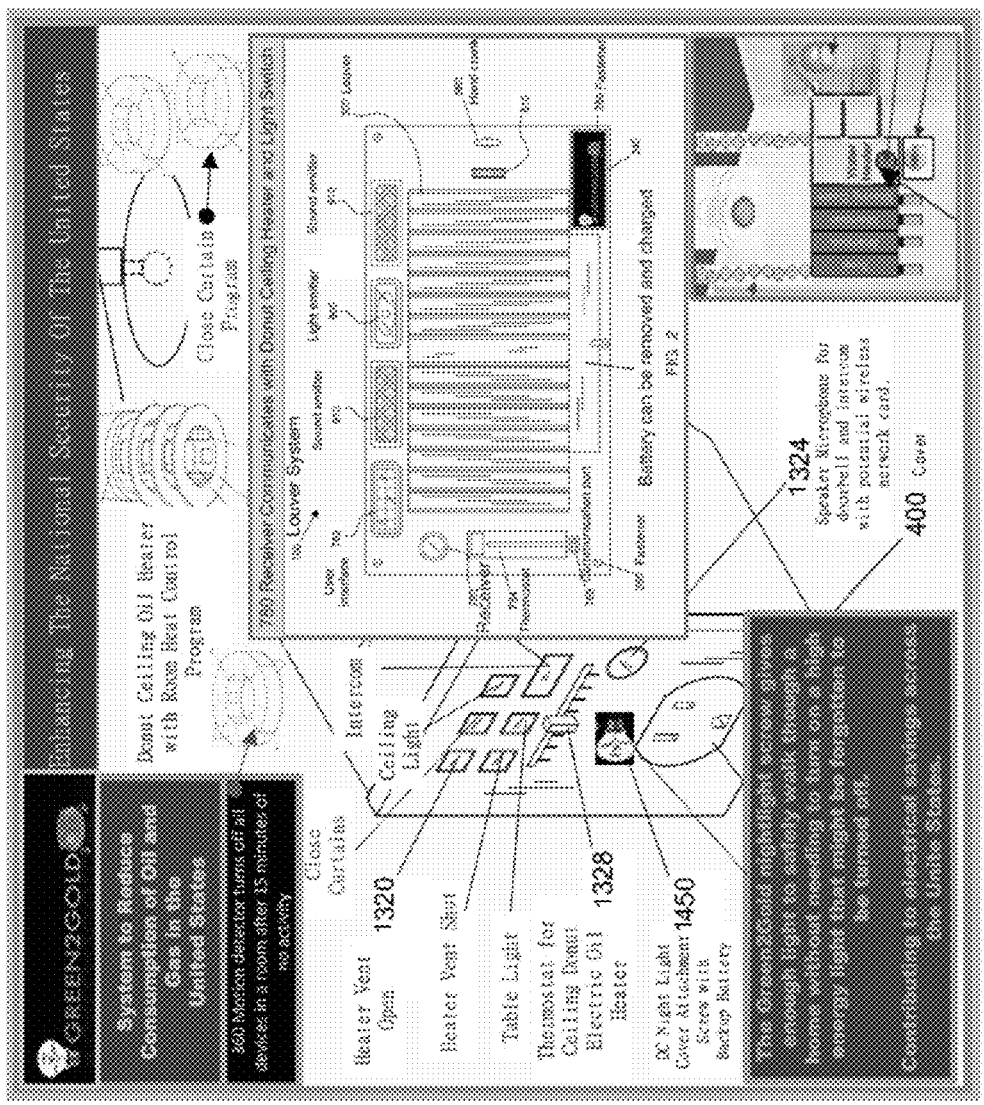
FIG. 22 shows a louver and smoke detector with electrical box system.

Disposed on the base 110-1 at the top end 111 of the base 110-1 is one or more mounting holes 130 adapted to receive screws, bolts, nails, and the like. The mounting holes 130 may be, for example, disposed at the intersection of the top end 111 of the base 110-1 and the aperture 115 in the top end 111 of the base 110-1. The mounting holes 130 allow a light fixture or other fixture to be attached to the base 110-1 (e.g., see FIG. 21 showing a fixture attached at the top end of the base 110-1). The base 110-1 may be attached to the wall or ceiling such that the optional bottom end 112 (e.g., electrical box) of the base is embedded in the ceiling or wall or the optional bottom end 112 (e.g., electrical box) of the base 110-1 is generally flush with the wall or ceiling. The screws, bolts, and/or nails can be driven through the mounting holes 130. Screws, bolts, and/or nails can be driven through the mounting holes 130.

In some embodiments, the optional bottom end 112 (e.g., electrical box) is removable. In some embodiments, the bottom end 112 or a portion of the base 110-1 at the bottom end 112 is removably attached to the base 110-1 via an attachment means. For example, as shown in FIG. 20, the attachment means may include mounting slots 130a disposed in the base 110-1 at the connection between the base 110-1 and the second end 112. Nails, screws, and the like can be threaded through the mounting slots 130a to secure the second end 112 (e.g., electrical box) to the base 110-1, for example. In some embodiments, a first nail slot mechanism 125a is disposed on the base 110-1 and/or on the second end 112 (e.g., electrical box), as shown in FIG. 17. In some embodiments, the first nail slot mechanism 125a allows a user to attach the device to a ceiling and/or joist, for example by driving a nail or screw through the first nail slot mechanism 125a.

In some embodiments, the optional bottom end 112 (e.g., electrical box) of the base 110-1 can be removed and an alternative item can be attached to the base 110-1 in its place. For example, in some embodiments, a light or a speaker is installed in place of the bottom end 112 of the base 110-1. In some embodiments, if the smoke detector device 100-1 is connected to an existing electrical fixture/box, the existing electrical fixture can still function as it did previously before the smoke detector device 100-1 was added. As an example, if the smoke detector device 100-1 is connected to an existing light fixture box, a light can be installed in lieu of the bottom end 112 of the base 110-1, allowing the light fixture box to still function to support the light while simultaneously supporting the smoke detector device 100-1.

In some embodiments, the smoke detector device 100-1 further comprises a plurality (e.g., two, three, etc.) of rings 200-1 that can be removably attached to (e.g., wrapping around) the base 110-1. The rings 200-1 can each move between an open and closed position so as to be fitted onto the base 110-1. In some embodiments, the smoke detector device 100-1 comprises a first ring 200a-1 (e.g., for a smoke alarm), a second ring 200b-1, and a third ring 200c-1. The first ring 200a-1 wraps around the first groove 120a, the second ring 200a-1 wraps around the second groove 120b, and the third ring 200c-1 wraps around the third groove 120c.

Each ring 200-1 can pivot between an open position and a closed position, for example via a second hinge mechanism 225. Each ring 200-1 may be divided into a first half ring and a second half ring, each half ring having a first end and a second end. The first end of the first half ring is pivotally attached to the first end of the second half ring, for example via the second hinge mechanism 225. Hinge mechanisms are well known to one of ordinary skill in the art.

In some embodiments, an inner ring groove 202 is disposed in the first ring 200a-1, for example in the inner cavity of the first ring 200a-1 (e.g., at the intersection of the top surface of the first ring 200a-1 and the inner cavity of the first ring 200a-1, as shown in FIG. 16).

The second end of each first half ring may be lockable to the second end of the respective second half ring to secure the ring 200-1 in the closed position. In some embodiments, a locking mechanism secures the ring 200-1 in the closed position. As an example, in some embodiments, a locking clip 212 is disposed on the second end of each first half ring. The locking clip 212 is for engaging a locking aperture 214 disposed in the second end of the respective second half ring. The locking clip 212 can snap into and out of the locking aperture 214. In some embodiments, a release button 290 is connected to each locking mechanism for unlocking the locking mechanism. For example, the release button 290 can move between a pressed position and a released position (the release button 290 may be biased in the released position, for example caused by a spring). When the release button 290 is in the pressed position, it pushes the respective locking clip 212 out of the locking aperture 214. Release buttons (e.g., spring-loaded buttons and the like) are well known to one of ordinary skill in the art.

In some embodiments, the rings 200-1 are divided into one or more modules that connect together to form the ring via a connecting means (e.g., see FIG. 11). Each module has an inner chamber for holding items. Each module comprises a door 480-1 (see FIG. 11) that can open and close respectively allowing and preventing access to the inner chamber of the module.

The modules of the smoke detector device 100-1 can accept other devices in addition to a smoke detecting component 250-1 including but not limited to a wireless network card 252, a speaker 255 (e.g., music speakers), a camera 272 (e.g., surveillance camera), a battery 258 (e.g., a rechargeable battery), a light 262, or a combination thereof (see FIG. 14). In some embodiments, the speakers can receive audio signals wirelessly from a music system (e.g., a stereo system, a MP3 player, etc.). In some embodiments, the music system comprises a corresponding wireless module attached to its audio output (for example, the AUX output on the back of the stereo). In some embodiments, the speaker 255 can also be programmed (e.g., via a microprocessor) to broadcast certain messages, for example a warning message in the case of a fire.

If needed, items in the rings 200-1 (modules) can be operatively connected to a power source. In some embodiments, the power source is a battery (e.g., rechargeable battery). In some embodiments, the power source is the electrical system of the existing electrical fixture. Wires can be directed from the wall or ceiling into the inner cavity of the base 110-1 (via the top aperture). In some embodiments, one or more base wire openings 145 are disposed in the base 110-1 (e.g., in the grooves 120 of the base 110-1), for example in the first groove 120a, second groove 120b, and third groove 120c (see FIG. 19). Wires can be directed out of the electrical box (e.g., bottom end 112 of the base 110-1) or inner cavity of the base 110-1 and into a ring 200-1 (e.g., a module) via module wire openings 146 in the ring/module. Base wire openings 145 in the base 110-1 may be aligned with module wire openings 146 of the rings 200-1 (modules). For example, a first base wire opening 145a is disposed in the first groove 120a, which can be aligned with a first module wire opening 146a disposed in the first ring 200a-1. A second base wire opening 145b is disposed in the second groove 120b, which can be aligned with a second module wire opening 146b disposed in the second ring 200b-1. A third base wire opening 145c is disposed in the third groove 120c, which can be aligned with a third module wire opening 146d disposed in the third ring 200c-1. Each ring 200-1 may have more than one module wire opening 146, and each groove 120 may have more than one base wire opening 145.

As shown in FIG. 20 and FIG. 21 the device 100-1 of the present invention can move between multiple positions including but not limited to an expanded position wherein the grooves 120 are each exposed (see FIG. 20) and a collapsed position wherein only the first groove 120a is exposed (see FIG. 21). In the expanded position, rings 200-1 can be wrapped around each exposed groove 120. In the collapsed position, only the first ring 200a-1 can be wrapped around the first groove 120a, since only the first groove 120a is exposed. As shown in FIG. 20, the base 110-1 is divided into telescopic portions, wherein the third groove 120c is in the inner telescopic portion 420c-1, the second groove 120b is in the middle telescopic portion 420b-1, and the third groove 120c is in the outer telescopic portion 420a-1. In some embodiments, the outer telescopic portion 420a-1 has a diameter larger than that of the middle telescopic portion 420b-1, which has a diameter larger than that of the inner telescopic portion 420c-1 (see FIG. 20). The middle telescopic portion 420b-1 slides into the outer telescopic portion 420a-1, and the inner telescopic portion 420c-1 slides into the middle telescopic portion 420b-1. The first flange 128a is part of the outer telescopic portion 420a-1 (at the top edge), the second flange 128b is part of the middle telescopic portion 420b-1 (at the top edge), and the third flange 128c is part of the inner telescopic portion 420c-1.

The first flange 128a and the second flange 128b contact each other when the middle telescopic portion 420b-1 slides into the outer telescopic portion 420a-1. The third flange 128c and the second flange 128b contact each other when the inner telescopic portion 420c-1 slides into the middle telescopic portion 420b-1. The inner ring groove 202 of the first ring 200a-1 accommodates the first flange 128a, second flange 128b, and third flange 128c when the device 100-1 is in the collapsed position, for example the inner ring groove 202 of the first ring 200a-1 wraps around the flanges 128 allowing the first ring 200a-1 to be wrapped around the first groove 120a despite the presence of the flanges 128.

Disposed around the outer bottom edge of the middle telescopic portion 420b-1 of the base 110-1 is a middle telescopic portion lip 422b. The first flange 128a juts inwardly slightly (inwardly toward the inner cavity of the base 110-1) creating a first flange lip 129a. In the expanded position, the middle telescopic portion lip 422b and the first flange lip 129a of the first flange 128 contact each other. The middle telescopic portion lip 422b and the first flange lip 129a help prevent the middle telescopic portion 420b-1 from being detached from the outer telescopic portion 420a-1. For example, the first flange lip 129a blocks further upward movement of the middle telescopic portion Hp 422c if the middle telescopic portion 420b-1 is pulled too far away from the outer telescopic portion 420a-1.

Disposed around the outer bottom edge of the inner telescopic portion 420c-1 of the base 110-1 is an inner telescopic portion lip 422c. The second flange 128b juts inwardly slightly (inwardly toward the inner cavity of the base 110-1) creating a second flange lip 129b. In the expanded position, the inner telescopic portion lip 422c and the second flange lip 129b of the second flange 128b contact each other. The inner telescopic portion lip 422c and the second flange lip 129b help prevent the inner telescopic portion 420c-1 from being detached from the middle telescopic portion 420b-1. For example, the second flange lip 129b blocks further upward movement of the inner telescopic portion lip 422c if the inner telescopic portion 420c-1 is pulled too far away from the middle telescopic portion 420b-1.

A first set screw 430a-1 (or more than one first set screws 430a-1) is disposed in the first groove 120a (in the outer telescopic portion 420a-1 of the base 110-1) near (and under) the first flange 128a. The first set screw 430a-1 can be rotated in a first direction and a second direction respectively moving the first set screw 430a-1 inwardly towards (and into) the inner cavity of the base 110-1 and outwardly away from the base 110-1. The first flange 128a and the first set screw 430a-1 are spaced apart a first distance. The first distance accommodates the middle telescopic portion lip 422b. When the middle telescopic portion 420b-1 of the base is slid (upwardly) out of the outer telescopic portion 420a-1 and the first set screw 430a-1 is rotated in the first direction into the inner cavity of the base 110-1, the first set screw 430a-1 and first flange 128 sandwich the middle telescopic portion lip 422b. This secures the middle telescopic portion 420b-1 in the expanded position (out of the outer telescopic portion 420a-1) as shown in FIG. 20. If the first set screw 430a-1 is rotated in the second direction away from the inner cavity of the base 110-1, the middle telescopic portion lip 422b is not sandwiched between the first flange 128a and first set screw 430a-1 and the middle telescopic portion 420b-1 is able to slide into the outer telescopic portion 420a-1 (to the collapsed position, see FIG. 21).

A second set screw 430b-1 (or more than one second set screws 430b-1) is disposed in the second groove 120b (in the middle telescopic portion 420b-1 of the base 110-1) near (and under) the second flange 128b. The second set screw 430b-1 can be rotated in a first direction and a second direction respectively moving the second set screw 430b-1 inwardly towards (and into) the inner cavity of the base 110-1 and outwardly away from the base 110-1. The second flange 128b and the second set screw 430b-1 is spaced apart a second distance. The second distance accommodates the inner telescopic portion lip 422c. When the inner telescopic portion 420c-1 of the base is slid (upwardly) out of the middle telescopic portion 420b-1 and the second set screw 430b-1 is rotated in the first direction into the inner cavity of the base 110-1, the second set screw 430b-1 and second flange 128b sandwich the inner telescopic portion lip 422c. This secures the inner telescopic portion 420c-1 in the expanded position (out of the middle telescopic portion 420b-1) as shown in FIG. 20. If the second set screw 430b-1 is rotated in the second direction away from the inner cavity of the base 110-1, the inner telescopic portion lip 422c is not sandwiched between the second flange 128b and second set screw 430b-1 and the inner telescopic portion 420c-1 is able to slide into the middle telescopic portion 420b-1 (to the collapsed position, see FIG. 21).

Various modifications of the invention, in addition to those described herein, will be apparent to those skilled in the art from the foregoing description. Such modifications are also intended to fall within the scope of the appended claims. Each reference cited in the present application is incorporated herein by reference in its entirety.

Although there has been shown and described the preferred embodiment of the present invention, it will be readily apparent to those skilled in the art that modifications may be made thereto which do not exceed the scope of the appended claims. Therefore, the scope of the invention is only to be limited by the following claims.

The reference numbers recited in the below claims are solely for ease of examination of this patent application, and are exemplary, and are not intended in any way to limit the scope of the claims to the particular features having the corresponding reference numbers in the drawings.

What is claimed is:

1. A fixture and electrical control system (10) for promoting safety and facilitating energy conservation, said fixture and electrical control system (10) comprising:
   a. the louver system (100) for controlling airflow in a duct (110) from a forced air heating, ventilation, and air conditioning (HVAC) system comprising:
      i. a housing (200) having a housing perimeter wall (210), a housing front edge (220), a housing rear edge (230), and a mounting fascia (240) disposed on the housing front edge (220);
      ii. a positionable louver (300) rotatably disposed on the mounting fascia (240);
      iii. a longitudinal slat (400), wherein the slat (400) comprises a slat first end (410), a slat second end (420), a slat first side edge (430), a second side edge, a slat first surface (450), a slat second surface (460), and a slat positioning wheel (480) disposed on the slat first end (410), wherein the slat first end (410) is rotatably disposed in the housing perimeter wall (210), wherein the slat second end (420) is rotatably disposed in the housing perimeter wall (210), wherein, in a fully open position, the slat first side edge (430) is disposed toward the housing front edge (220) and the slat second side edge (440) is disposed toward the housing rear edge (230) or the slat second side edge (440) is disposed toward the housing front edge (220) and the slat first side edge (430) is disposed toward the housing rear edge (230), wherein the slat (400) is positioned fully in-line with a direction of airflow from a duct (110), whereby in the fully open position the slat (400) does not impede the airflow in the duct, wherein, in a fully closed position, the slat first side edge (430) is disposed toward the housing perimeter wall (210) and the slat second side edge (440) is disposed toward the housing perimeter wall (210), wherein the slat (400) is positioned fully perpendicular to the direction of airflow from the duct (110), wherein the slat first surface (450) or the slat second surface (460) faces the direction of airflow from the duct (110), whereby in the fully closed position the slat (400) impedes the airflow in the duct, wherein, the slat (400) is rotatable in a single continuous direction, wherein the slat (400) is infinitely positionable between the fully open position and the fully closed position;
      iv. a slat positioning assembly (500) disposed in the housing (200) comprising a centrally located main shaft (530) having a main shaft positioning wheel (540) disposed on the main shaft (530) proximal to a main shaft first end (532), wherein the main shaft (530) is disposed parallel to the slat (400), wherein a drive belt (550) is disposed on and engages the main shaft positioning wheel (540) and the slat positioning wheel (480), wherein a positioning gear (560) is disposed on the main shaft (530) proximal to the main shaft first end (532), wherein a solenoid actuator (570) is disposed in the housing (200), wherein the solenoid actuator (570) comprises an engagement tip (580) for engaging the positioning gear (560);
      v. a mainspring assembly (600) disposed in the housing (200), wherein the mainspring assembly (600) comprises a ratcheting mechanism (610) operatively coupled to the main shaft (530), wherein a spring coil (620) is operatively coupled to the ratcheting mechanism (610);
      vi. a winding assembly (650) disposed in the housing (200) operatively coupled to the mainspring assembly (600) comprising a hand crank (660),
         (a) a safety block (1200) comprising a safety-block rear (1202), a safety-block front (1204), a safety-block cavity (1206), a safety-block alternating current (AC) power supply connector (1210), and a safety-block AC power transfer connector (1220),
      wherein said safety-block rear (1202) comprises the safety-block AC power supply connector (1210) disposed thereon, wherein said safety-block AC power supply connector (1210) operatively attaches to an AC power supply (1130), wherein said safety-block AC power supply connector (210) passes through the safety block (1200) via the safety-block cavity (1206), wherein said safety-block front (1204) comprises a safety-block AC power transfer connector (1220) disposed thereon, wherein said safety-block AC power transfer connector (1220) operatively attaches to the safety-block AC power supply connector (1210), wherein the safety block further comprises a plurality leveling screws disposed on each side thereon, said leveling screws, adjustably affix the safety block into a static, level position inside a household electrical box; and
         (b) a control module (1300) comprising a control-module rear (1302), a control-module user interface (1304), a control-module cavity (1306), and a control-module alternating current (AC) power connector (1335);
      wherein said control-module rear (1302) comprises the control-module AC power connector (1335) disposed thereon, wherein said control-module power connector (1335) operatively connects to the safety-AC block AC power transfer connector (1220), wherein said control-module AC power connector (1335) passes through the control module (1300) via the control-module cavity (1306), wherein said control-wherein the hand crank (660) projects through an aperture disposed on the mounting fascia (240), wherein upon actuation of the hand crank, the mainspring assembly is rewound;
      vii. a motor (700) disposed in the housing (200) operatively coupled to the winding assembly (650), wherein upon actuation of the motor, the mainspring assembly is rewound;
      viii. a local control system (750) disposed in the housing (200) having a microprocessor (760), a transmitter (770), and a receiver (780), wherein the local control system (750) is operatively connected to the slat positioning assembly (500), wherein the local control system (750) is operatively connected to the motor (700), wherein the local control system (750) is operatively connected to the solenoid actuator (570);
      ix. a power supply (800) disposed in the housing (200) operatively connected to the motor (700) and the local control system (750); and
      x. an electricity generator (850) rotatably disposed in the housing (200) comprising a turbine (860), wherein the electricity generator (850) is operatively connected to the power supply (800), wherein when airflow is present, the turbine (860) rotates the electricity generator (850) thereby producing a current, wherein the current charges the power supply (800);

b. a smoke detector device comprising:
  i. an elongated base (110-1) having a top end (111), a bottom end, and a generally hollow inner cavity, wherein the bottom end (112) is an electrical box (1000) for fixtures, devices and appliances consolidating multiple control points, and safely isolating a typical household power source, for promoting safety and facilitating energy conservation, wherein the electrical box (1000) comprises:
    module user interface (1304) operatively attaches to the control-module AC power connector (1335);
  ii. a top aperture (115) disposed in the top end (111) of the base (110-1) for providing access to the inner cavity of the base (110-1) via the top end (111);
  iii. a first groove (120*a*) disposed in an outer surface of the base (110-1), a third groove (120*c*) disposed in the outer surface of the base (110-1) below the top end (111) of the base (110-1), and a second groove (120*a*) disposed in the outer surface of the base (110-1) in between the first groove (120*a*) and the third groove (120*c*);
  iv. a first flange (128*a*) extending outwardly from the outer surface of the base (110-1) in between the first groove (120*a*) and the second groove (120*b*), a second flange (128*b*) extending outwardly from the outer surface of the base (110-1) in between the second groove (120*b*) and the third groove (120*c*), and a third flange 128*c* extending outwardly from the outer surface of the base (110-1) above the third groove (120*c*) at the top end (111) of the base (110-1);
  v. a first ring (200*a*-1) for wrapping around the first groove (120*a*), a second ring (200*b*-1) for wrapping around the second groove (120*b*), and a third ring (200*c*-1) for wrapping around the third groove (120*c*);
  vi. a first base wire opening (145*a*) is disposed in the first groove (120*a*), a second base wire opening (145*b*) is disposed in the second groove (120*b*), and a third base wire opening (145*c*) is disposed in the third groove (120*c*); and
  vii. a first module wire opening (146*a*) disposed in the first ring (200*a*-1), a second module wire opening (146*b*) disposed in the second ring (200*b*-1), and a third module wire opening (146*c*) disposed in the third ring (200*c*-1), wherein the first base wire opening (145*a*) is aligned with the first module wire opening (146*a*), the second base wire opening (145*b*) can be aligned with the second module wire opening (146*b*), and the third base wire opening (145*c*) can be aligned with the third module wire opening (146*c*) so as to allow a wire from the inner cavity of the base to be directed into the respective ring (200-1);
wherein the electrical box (1000) isolates a typical household power source via the features of the safety block (1200), and consolidates multiple control points to remotely activate the louver system via the features of the control module (1300), thereby promoting safety and facilitating energy conservation, wherein the control module (1300) sends an activation signal to the local control system (750) of the louver system (100); and
wherein upon receiving an activation signal, the local control system (750) sends a positioning signal via the microprocessor (760) to the solenoid actuator (570), wherein the solenoid actuator (570) releases the stored energy from the mainspring assembly (600) to actuate the slot positioning assembly (500) via the positioning gear (560) and the engagement tip (580), wherein the slat positioning assembly (500) rotates the slat (400) to a specified position, wherein in the fully open position, the slat (400) allows airflow, wherein the fully closed position, the slat (400) inhibits airflow, wherein in a position between the fully open position and the fully closed position (partially open), the slat (400) allows an inhibited rate of airflow, wherein the mainspring assembly (600) is wound via the winding assembly (650), wherein the winding assembly (650) is actuated via the hand crank (660) or the motor (700).

2. The system (10) of claim 1, wherein a sound emitter (910) disposed in the housing (200) is operatively connected to the microprocessor (760), wherein upon receiving a signal from the microprocessor (760), the sound emitter (910) emits a sound, wherein operating power is supplied to the sound emitter (910) via the power supply (800), via the microprocessor (760).

3. The system (10) of claim 1, wherein a light emitter (900) disposed in the housing (200) is operatively connected to the microprocessor (760), wherein upon receiving a signal from the microprocessor (760), the light emitter (900) emits light, wherein operating power is supplied to the light emitter (900) via the power supply (800), via the microprocessor (760).

4. The system (10) of claim 1, wherein the system (100) comprises a user interface (762) disposed in the housing (200), wherein the user interface (762) is operatively connected to the microprocessor (760).

5. The system (10) of claim 1, wherein the system (100) comprises a thermostat (764) disposed in the housing (200), wherein the thermostat (764) is operatively connected to the microprocessor (760).

6. The system (10) of claim 1, wherein the slat positioning assembly (500) is coupled to the winding assembly (650), wherein upon receiving an activation signal via the microprocessor (760), the slat (400) is configured to spin freely via the airflow that passes through the housing (200), wherein upon spinning freely, the slat (400) activates the winding assembly (650) to wind the mainspring assembly (600).

7. The system (10) of claim 1, wherein the base 110-1 is divided into an outer telescopic portion 420*a*-1 comprising the first groove 120*a* and the first flange 128*a*, a middle telescopic portion 420*b*-1 comprising the second groove 120*b* and the second flange 128*b*, and an inner telescopic portion 420*c*-1 comprising the third groove 120*c* and the third flange 128*c*, the middle telescopic portion 420*b*-1 can slide into the outer telescopic portion 420*a*-1 until the second flange 128*b* and first flange 128*a* contact each other, and the inner telescopic portion 420*c*-1 can slide into the middle telescopic portion 420*b*-1 until the second flange 128*b* and third flange 128*c* contact each other.

8. The system (10) of claim 7, wherein a middle telescopic portion lip 422*b* is disposed around an outer bottom edge of the middle telescopic portion 420*b*-1 of the base 110-1 and an inner telescopic portion lip 422*c* is disposed around an outer bottom edge of the inner telescopic portion 420*c*-1 of the base 110-1.

9. The system (10) of claim 8, wherein the first flange 128*a* juts inwardly toward the inner cavity of the base 110-1 creating a first flange lip 129*a* and the second flange 128*b* juts inwardly toward the inner cavity of the base 110-1 creating a second flange lip 129*b*, wherein the first flange lip 129*a* helps prevent the middle telescopic portion 420*b*-1 from being detached from the outer telescopic portion 420*a*-1 by blocking upward movement of the middle telescopic portion lip 422b past the first flange lip 129a, and the second flange lip 129b helps prevent the inner telescopic portion 420c-1 from being detached from the middle telescopic portion 420b-1 by blocking upward movement of the inner telescopic portion lip 422c past the second flange lip 129b.

10. The system (10) of claim 9 further comprising a first set screw 430a-1 disposed in the first groove 120a in the outer telescopic portion 420a-1 of the base 110-1 a first distance below the first flange 128a, the first set screw 430a-1 is configured to rotate in a first direction and a second direction respectively moving the first set screw 430a-1 inwardly into the inner cavity of the base 110-1 and outwardly away from the inner cavity of the base 110-1, wherein when the middle telescopic portion 420b-1 of the base is slid upwardly out of the outer telescopic portion 420a-1 and the first set screw 430a-1 is rotated in the first direction into the inner cavity of the base 110-1, the first set screw 430a-1 and first flange 128 sandwich the middle telescopic portion lip 422b to secure the middle telescopic portion 420b-1 out of the outer telescopic portion 420a-1 and when the first set screw 430a-1 is rotated in the second direction away from the inner cavity of the base 110-1 the middle telescopic portion lip 422b is not sandwiched between the first flange 128a and first set screw 430a-1 and the middle telescopic portion 420b-1 slides into the outer telescopic portion 420a-1.

11. The system (10) of claim 10 further comprising a second set screw 430b-1 disposed in the second groove 120b in the middle telescopic portion 420b-1 of the base 110-1 a second distance below the second flange 128b, the second set screw 430b-1 is configured to rotate in a first direction and a second direction respectively moving the second set screw 430b-1 inwardly into the inner cavity of the base 110-1 and outwardly away from the inner cavity of the base 110-1, wherein when the inner telescopic portion 420c-1 of the base is slid upwardly out of the middle telescopic portion 420b-1 and the second set screw 430b-1 is rotated in the first direction into the inner cavity of the base 110-1, the second set screw 430b-1 and second flange 128b sandwich the inner telescopic portion lip 422c to secure the inner telescopic portion 420c-1 out of the middle telescopic portion 420b-1 and when the second set screw 430b-1 is rotated in the second direction away from the inner cavity of the base 110-1, the inner telescopic portion lip 422c is not sandwiched between the second flange 128b and second set screw 430b-1 and the inner telescopic portion 420c-1 is able to slide into the middle telescopic portion 420b-1.

12. The system (10) of claim 11 further comprising an inner ring groove 202 disposed in the first ring 200a-1 at an intersection of a top surface of the first ring 200a-1 and an inner cavity of the first ring 200a-1, wherein the inner ring groove 202 wraps around the first flange 128a, second flange 128b, and third flange 128c when the first ring 200a-1 is wrapped around the first groove 120a when the middle telescopic portion 420b-1 is in the outer telescopic portion 420a-1 and the inner telescopic portion 420c-1 is in the middle telescopic portion 420b-1.

13. The system (10) of claim 1, wherein each ring 200-1 is configured to pivot between an open position and a closed position via a second hinge mechanism 225 so as to be fitted onto its respective groove 120.

14. The system (10) of claim 13, wherein the smoke detector device further comprises a locking mechanism 212, 214 for securing each ring 200-1 in the closed position.

15. The system (10) of claim 14, wherein the smoke detector device further comprises a release button 290 connected to the locking mechanism 212, 214 for unlocking the locking mechanism 212, 214.

16. The system (10) of claim 1, wherein at least one ring 200-1 comprises at least two modules 210-1, 220-1, 230-1, 240-1, each module 210-1, 220-1, 230-1, 240-1 comprising an inner chamber and a door 480-1, the inner chamber of each module 210-1, 220-1, 230-1, 240-1 is configured to hold an item, the door 480-1 of each module 210-1, 220-1, 230-1, 240-1 is configured to move between an open position and a closed position for respectively allowing and preventing access to the inner chamber of the module 210-1, 220-1, 230-1, 240-1.

17. The system (10) of claim 16, wherein the modules 210-1, 220-1, 230-1, 240-1 are configured to removably connect together via a connecting means 228.

18. The system (10) of claim 17, wherein the connecting means 228 is a hinge mechanism, a locking mechanism, an assembly clip, a clamp, a snap, an adhesive, a hook-and-loop fastener, or a combination thereof.

19. The system (10) of claim 1, wherein the base 110-1 is cylindrical in shape.

20. The system (10) of claim 1, wherein the grooves 120 are ring-shaped.

* * * * *